(12) United States Patent
Tsuneta et al.

(10) Patent No.: US 7,863,564 B2
(45) Date of Patent: Jan. 4, 2011

(54) ELECTRIC CHARGED PARTICLE BEAM MICROSCOPE AND MICROSCOPY

(75) Inventors: Ruriko Tsuneta, Fuchu (JP); Hideki Kikuchi, Hitachinaka (JP); Takafumi Yotsuji, Hitachinaka (JP); Toshie Yaguchi, Omitama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 241 days.

(21) Appl. No.: 12/259,771

(22) Filed: Oct. 28, 2008

(65) Prior Publication Data

US 2009/0127474 A1      May 21, 2009

(30) Foreign Application Priority Data

Oct. 29, 2007      (JP)      .............................. 2007-279781

(51) Int. Cl.
*H01J 49/00*      (2006.01)
(52) U.S. Cl. ........................ 250/306; 250/307; 250/310; 250/396 R; 250/397; 250/398
(58) Field of Classification Search ........................ None
See application file for complete search history.

(56) References Cited

U.S. PATENT DOCUMENTS

| 4,242,586 | A | * | 12/1980 | Warble .................... 250/443.1 |
| 6,570,156 | B1 | | 5/2003 | Tsuneta et al. |
| 7,372,029 | B2 | * | 5/2008 | Tsuneta et al. .............. 250/311 |
| 7,372,051 | B2 | * | 5/2008 | Tsuneta et al. ........... 250/492.3 |
| 7,381,968 | B2 | * | 6/2008 | Tanaka et al. .......... 250/440.11 |
| 7,388,198 | B2 | * | 6/2008 | Ohkura ....................... 250/305 |
| 7,649,172 | B2 | * | 1/2010 | Ozawa et al. ............... 250/306 |
| 2005/0194535 | A1 | | 9/2005 | Noji et al. |
| 2008/0073533 | A1 | * | 3/2008 | Makino et al. .............. 250/310 |
| 2008/0121803 | A1 | * | 5/2008 | Shojo et al. ................. 250/307 |
| 2008/0283748 | A1 | * | 11/2008 | Matsumoto et al. ......... 250/311 |
| 2008/0283750 | A1 | * | 11/2008 | Nakazawa et al. .......... 250/311 |
| 2009/0127474 | A1 | * | 5/2009 | Tsuneta et al. ......... 250/442.11 |
| 2009/0146075 | A1 | * | 6/2009 | Schmid et al. ......... 250/442.11 |
| 2010/0065753 | A1 | * | 3/2010 | Enyama et al. .............. 250/397 |

FOREIGN PATENT DOCUMENTS

| EP | 1 071 112 A | 1/2001 |
| JP | 08-106873 | 4/1996 |
| JP | 11-288679 | 10/1999 |
| JP | 2000-082433 | 3/2000 |
| JP | 2000-331637 | 11/2000 |
| JP | 2001-098048 | 4/2001 |
| JP | 2001-312989 | 11/2001 |
| JP | 2004-301853 | 10/2004 |
| JP | 3677895 | 5/2005 |
| WO | WO2006/121108 A | 11/2006 |

* cited by examiner

*Primary Examiner*—David A Vanore
(74) *Attorney, Agent, or Firm*—Mattingly & Malur, P.C.

(57) ABSTRACT

An electric charged particle beam microscope is provided in which a specimen movement due to a specimen rotation is classified into a repeatable movement and a non-repeatable movement, a model of movement is determined for the repeatable movement, a range of movement is determined for the non-repeatable movement, the repeatable movement is corrected on the basis of the movement model through open-loop and the non-repeatable movement is corrected under a condition set on the basis of the range of movement.

7 Claims, 18 Drawing Sheets

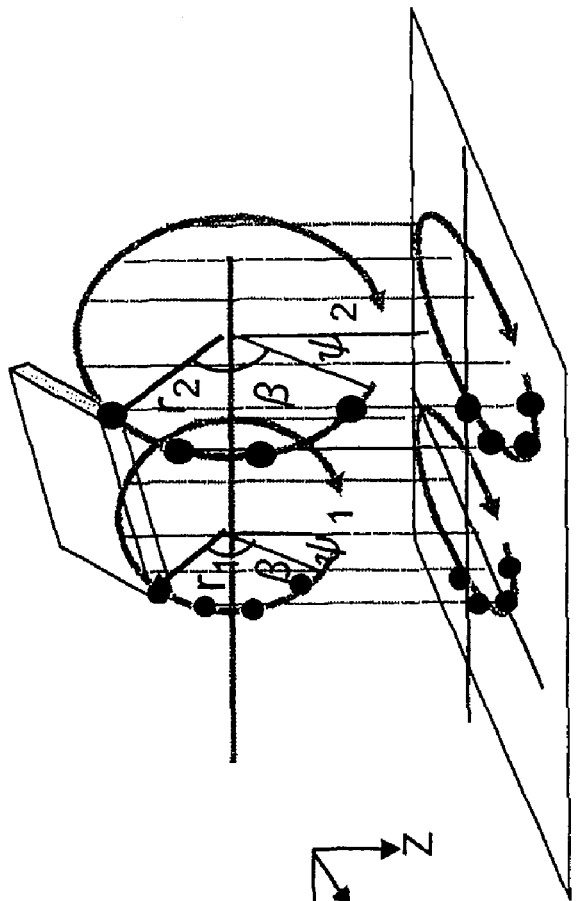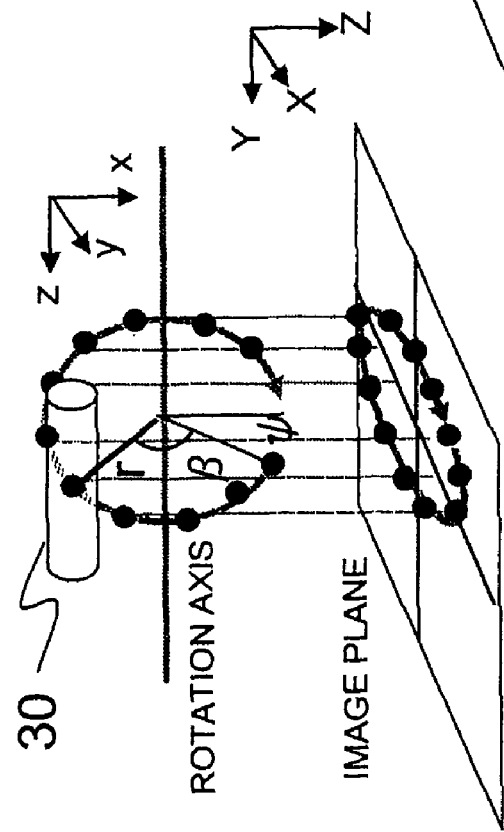

FIG.16A

CONDITION OF IMAGE SEARCH

SEARCH METHOD [ AUTO-CORRELATION ]
THRESHOLD [ 50 ]
LIMIT OF PEAK POSITION [ 10 μm ]

[✓] SAVE LOG

FIG.16B

CONDITION OF MODEL FITTING

FUNCTION $\begin{bmatrix} X \\ Y \\ Z \end{bmatrix} = \begin{bmatrix} r\cos\phi\cos\theta\cos(\beta+\psi) - r\sin\phi\sin(\beta+\psi) \\ r\sin\phi\cos\theta\cos(\beta+\psi) + r\cos\phi\sin(\beta+\psi) \\ -r\sin\theta\cos(\beta+\psi) \end{bmatrix}$

| PARAMETER | INITIAL | MAX | MIN |
|---|---|---|---|
| θ | 90° | 90° | 90° |
| Φ | 110° | 90° | 130° |
| ψ | 0° | -30° | +30° |
| R | 30 μm | 1 μm | 50 μm |

MAX NUMBER OF REPEAT [ 80 ]     [✓] SAVE LOG
THRESHOLD [ 80 ]

FIG.16C

CONDITION OF AUTO-FOCUS

FOCUS STEP [ 3 μm ]
NUMBER OF MEASUREMENT [ 20 ]

WARNING MESSAGE

THE RANGE OF THE FOCUS SEARCH IS SET MORE WIDELY THAN THE RECOMMENDED VALUE.

FIG.16D

CONDITION OF AUTO-FOCUS

TILT ANGLE OF INCIDENCE BEAM [ 10 mrad ]

DISPLACEMENT DUE TO BEAM TILT AT JUST FOCUS

MEASURE PROPORTION COEFFICIENT

ELECTRIC CHARGED PARTICLE BEAM MICROSCOPE AND MICROSCOPY

INCORPORATION BY REFERENCE

The present application claims priority from Japanese application JP2007-279781 filed on Oct. 29, 2007, the content of which is hereby incorporated by reference into this application.

BACKGROUND OF THE INVENTION

The present invention relates to an apparatus of automatically correcting movement of a specimen three-dimensionally during rotation of the specimen in an electric charged particle beam microscope having a specimen rotation mechanism.

In respective fields of semiconductor device, nano-material, biotechnology and the like, the need for analyzing the structure of a specimen three-dimensionally in an order of nano-meter (nm) has been increasing. Available as an apparatus for observation of s specimen in a nm order are a transmission electron microscope (TEM) and a scanning electron microscope (SEM), by which three-dimensional observation of a specimen structure can be performed by rotating the specimen to observe it in various radial directions.

Japanese Patent No. 3677895 describes, as a technique for three-dimensional observation, an electron microscope for three-dimensional observation and a microscopic method which will be described below. More particularly, a portion to be observed is cut into a projecting shape by using a focused ion beam. The diameter of the projecting portion is set to a value that permits an electron beam to transmit through the portion. The cut-off piece of specimen is fixedly mounted to a uniaxial all-direction rotational specimen holder while making the projection center axis coincident with the specimen rotation axis and the observing objective is observed in all radial directions of uniaxial rotation in a specimen chamber of the electron microscope. Since the observation direction is not limited in the general-use TEM/STEM using thin-film specimens, the specimen structure can be observed three-dimensionally with ease. When restructuring a specimen structure from transmission images obtained through observations in various directions, the specimen structure of less artifact can be restructured.

In three-dimensional observation, a specimen is rotated frequently in order to observe the specimen in various directions. A factor of degrading the TAT (thematic apperception test) in the three-dimensional observation originates from correction of a movement of specimen due to a specimen rotation. In the electron microscope, the view-field diameter is in an order of micrometer ($\mu m$) and therefore, it is difficult to fixedly mount a specimen by coinciding the specimen position with the rotation axis exactly with this accuracy. For this reason, as the specimen rotates, the specimen will sometimes move around the rotation axis to deviate from the view-field. To cope with this problem, three kinds of techniques have been disclosed as will be described below.

In the first place, there is a technique for mechanically coinciding the specimen position with the specimen rotation axis. JP-A-2001-312989 gives a description to the following effect. A mechanism is provided which adjusts the direction of the whole of a uni-centrically adjusted stage system to align the rotation axis with the electron microscope center, that is, an adjustment mechanism is provided which includes a second spherical seat capable of adjusting the direction in which the whole of the uni-centrically adjusted stage is mounted to the electron microscope. With this mechanism, the whole of the stage can be rotated on the second spherical seat without disturbing the uni-centric condition of the rotary cylinder and a specimen holder, thus succeeding in setting of alignment of the cylinder rotary axis direction with the electron microscope view-field center.

A second technique is for measuring and recording a specimen movement due to a specimen rotation in advance and adjusting the specimen stage on the basis of the record such that the specimen movement can be cancelled out. JP-A-8-106873 gives a description to the following effect. An amount of positional displacement of a target area (standard specimen) or an observation objective area (actual specimen) on a plane orthogonal to the electron beam optical axis can be detected by comparing electron microscopic images before and after specimen rotation with each other whereas an amount of positional displacement of a target area or an observation objective area in the direction of electron beam optical axis can be detected by measuring a distribution of intensities of Fresnel fringes developing in an electron microscopic image of the specimen. Then, amounts of positional displacements at a rotation angle $\theta$ in X-axis, Y-axis and Z-axis directions are determined on the basis of information of the stored positional displacement amounts and position correction signals of values of a sign inverse to the positional displacement amount are generated and forwarded to a specimen moving mechanism control system which in turn corrects the positional displacements.

A third technique is for sequentially measuring and correcting specimen movements due to specimen rotations without resort to the use of records of specimen movements. JP-A-11-288679 gives a description to the following effect. In order to rotate a specimen to an intended direction, a crystal azimuth and the direction and angle of a specimen rotation necessary for directionality from the azimuth toward an intended azimuth of observation are calculated. A specimen rotation mechanism is so controlled as to slightly rotate the specimen to such an extent that an image of the specimen does not deviate from the screen of a display means and the thus developing positional displacement of the specimen is calculated by an analyzing means. As the specimen positional displacement analyzing means, a means for analyzing a positional displacement between images through a mutual correlation method is described. A position correction means controls the specimen moving mechanism and a deflection coil such that the positional displacement can be eliminated, thereby enabling position correction control to be carried out. Then, the specimen rotation and position correction control as above are repeated until the rotation in the intended azimuth can be attained.

Further, the specimen movement measurement can principally be classified into movement measurement in XY plane orthogonal to the electron beam optical axis and movement measurement in Z direction parallel to the electron beam optical axis. In the case of the movement in XY plane, a movement of a specimen is measured by taking images before and after specimen movement and processing the picked up images through a normalized mutual correlation method or a phase limited correlation method. A specimen movement in Z direction is measured from a specimen position in relation to a focal position of the electron lens. Available as a specimen defocus amount measurement method is a method of utilizing parallax and a method of utilizing an image sharpness degree evaluation value. JP-A-2000-331637 gives a description to the effect that a positional displacement amount due to parallax of the electron microscope is detected through image processing and the result is fed back to the electron beam apparatus. JP-A-2001-098048 gives a description purporting that the direction/magnitude of an astigmatic difference and the focal offset are detected by image-processing two-dimensional particle images acquired by changing the focal point and then, they are collectively converted into two kinds of astigmatism correction amount and focus correction amount for execution of correction. In the method as above, about 20 sheets of a series of defocus images are used typically.

SUMMARY OF THE INVENTION

By presupposing actual image pickup, for example, observation of a semiconductor device and by taking an instance where the prior arts for correcting the specimen movement due to the specimen rotation is applied, the correction error, time for an adjustment executed in advance of image pickup of a series of rotation images and time for correction of a positional displacement during the rotation series image pickup will be examined. In the semiconductor device observation, observation is conducted at a magnification of about 200 k (view-field diameter being about 0.5 μm) in many applications. A permissible correction error is assumed to be less than 10% of the view-field diameter and is set to ±0.05 μm or less.

In the technique disclosed in JP-A-2001-312989, the correction error is limited by an error in positioning the specimen stage. The specimen stage positioning error is of μm order, leading to insufficient accuracy. Further, the time for adjustment executed before the rotation series image pickup is needed. Skill is required for the adjustment and depending on operators, a very long time will sometimes be consumed. No positional displacement correction is carried out during rotation series image pickup and consequently, the correction time is zero.

The correction error in the case of using the technique of JP-A-8-106873 is also limited by the specimen stage positioning error and is of μm order, resulting in insufficient accuracy. This Patent Document gives a description purporting that by executing parallel movement or translation of a specimen with the help of a piezoelectric device having high positioning accuracy, correction can be made with an accuracy of 10 nm but since the specimen movement amount due to the specimen rotation suffers an irregularity of μm order, the correction error will become μm order undoubtedly in the correction making reference to records. The adjustment time consumed in advance of the rotation series image pickup corresponds to time for measuring the locus of a specimen. Since the positional displacement amount in XY direction is measured from images taken before and after the specimen rotation, one image must be picked up in one direction and then subjected to one operation of image processing. The positional displacement amount in Z direction is measured from a series of defocus images and several tens of images must be picked up in one direction and then subjected to several tens of image processing operations and consequently, a measurement time of at least several minutes is required. The above operation is carried out in several tens of directions, demonstrating that the adjustment time consumed before the rotation series image pickup amounts up to several of tens of minutes. The position correction time during the rotation series image pickup involves only the specimen stage movement time and can be estimated to be several seconds per one image.

In the technique described in JP-A-11-288679, the specimen movement amount is measured every specimen rotation and is corrected by using the specimen stage and the deflection coil as well. The error in measuring the positional displacement amount in the XY plane and the error in correction using the deflection coil are 10 nm order and small enough. No adjustment is made in advance of the rotation series image pickup and therefore the adjustment time is zero. But the position correction time during the rotation series image pickup is very long. The specimen rotation angle gradation is made at small intervals to prevent the specimen from deviating from the view-field and the positional displacement of the specimen is measured gradation by gradation until a predetermined specimen rotation angle is reached. In other words, it will be understood that irrespective of the number of images taken for use in three-dimensional observation, images picked up in a great number of directions must be used. Further, only the positional displacement correction in the XY plane is described and no description of the positional displacement correction in the Z direction is given. As well known in the art, the position in the Z direction changes by several μm as the specimen rotation proceeds and if the image pickup continues without correcting a displacement in the Z direction, the image blurs because of a defocus, making it difficult to observe the specimen structure and measure the positional displacement amount in the XY direction. In other words, with the technique described in JP-A-11-288679 only, image pickup of a series of rotation images is difficult to achieve and so a focus correction technique needs to be added. With a focus correction step added, a correction time of several minutes per direction is required. This repeated every 1° to 2° step. On the assumption that the specimen is rotated through 0° to 180° consuming a correction time of 5 minutes per direction, only the position correction time excluding the image pickup time of rotation series images amounts up to 15 hours.

In the Z position correction or focus correction, the accuracy of measurement of parallax is proportional to the accuracy of focus measurement in the method described in JP-A-2000-331637. Accordingly, in order to upgrade the focus correction accuracy, the magnification must be high. At a high magnification, however, only a blurred image is obtained when the defocus amount is large and the positional displacement amount measurement is difficult to execute. Thus, the image pickup condition must be set in compliance with the defocus amount. Correction in multiple steps is required ranging from rough correction at low magnification to fine correction at high magnification.

In the method described in JP-A-2001-098048, a series of through-focus images are necessary and the accuracy of measurement of a focal position increases in proportion to an increase in the number of images taken. Typically, about 20 images are picked up. The image pickup condition must be set in compliance with the defocus amount. To sum up, as compared to measurement of XY positions, a larger number of images are needed in measurement of Z positions and with a view to improving the measurement accuracy, the number of necessary images increases more and more, indicating that the Z position measurement degrades the TAT in correction of the positional displacement due to the specimen rotation.

As will be seen from the above, when the correction of the positional displacement due to the specimen rotation is carried out in accordance with teachings of the prior arts, a very long correction time is consumed to meet the accuracy required for the rotation series image pickup.

It is an object of the present invention to shorten the correction time without degrading the correction accuracy.

According to the present invention, to accomplish the above object, an electric charged particle microscope having an electric charged particle source for generating a first electric charged beam, a generator for generating a first electromagnetic field used to lead the first electric charged particle beam to a specimen, a specimen stage for setting position and angle of the specimen in relation to the first electric charged particle beam, a generator for generating a second electromagnetic field used to lead a second electric charged particle beam given off from the specimen to a detector adapted to detect the second electric charged particle beam and an image former for forming an image indicative of a specimen structure on the basis of a detector output, comprises a specimen movement corrector including a recording unit for recording the relation between a specimen rotation angle and a specimen movement amount, a display unit for displaying the relation between a specimen rotation angle and a specimen movement amount, a first control unit for determining an amount of specimen movement amount due to a specimen rotation and correcting it on the basis of the relation between the specimen rotation angle and the specimen movement amount, and a second control unit for determining a specimen movement amount from an image taken before the specimen rotation and an image taken after the correction and correcting it.

The rotation series image pickup time according to the present invention will now be estimated and advantages of this invention will be testified. An examination will be made by taking a case where image pickup is conducted at a magnification of 200 k through 0° to 180° at intervals of 10°, for instance. Firstly, in preliminary measurement, a repeatable movement is modeled and the range of non-repeatable movement is specified. At a magnification of about 2 k, the diameter of a view-field is set to about 50 µm and 18 images are taken through 0° to 360° at intervals of 20°. The image pickup time is totalized by an image capture time (10 seconds/sheet) and a specimen rotation time (10 seconds/gradation inclusive of wait time), amounting up to 20 seconds×18 sheets=360 seconds=6 minutes. After the image pickup, the locus of the specimen movement is determined through image processing. Assumptively, from the thus obtained locus, a result is obtained which indicates that a repeatable movement is approximated by a circular movement model of a radius of 30 µm whereas a non-repeatable movement is confined within a range of ±4 µm. Time for the calculation is about 1 minute and time consumed before the rotation series image pickup is estimated to be 7 minutes in total. Next, a series of specimen rotation images are taken. After an image at a specimen rotation angle 0° has been picked up at a magnification for an image for specimen structure analysis, for example, at a magnification of 200 k (view-field diameter being 0.5 µm), an image for specimen position measurement is picked up at a magnification permitting a non-repeatable movement to be confined within the view-field, for example, at a magnification of 10 k (view-field diameter being 10 µm). Then, the specimen is rotated through 0° to 10°. Firstly, the specimen stage is so controlled as to cancel out a repeatable movement. Subsequently, a Z position is searched at a magnification of 10 k. In consideration of the fact that the irregularity in the movement amount due to the specimen rotation is ±4 µm and an error in Z positioning the stage is ±3 µm, a search range of ±9 µm is settled. On the assumption that search is conducted at intervals half the error in Z positioning the stage, amounting to 3 µm, the number of a series of defocus images is 7 and therefore the search time is about 1 minute. On the basis of the search result, the specimen is brought into lens focus by using specimen stage Z control. After focus correction, an image for XY position measurement is taken and compared with the image picked up at 0° to measure an XY movement amount, followed by correction of the XY positional displacement amount through the specimen stage XY control and the image shift deflector control. The position setting error by the specimen stage XY control is less than 1 µm and the work range of image shift is several µm. In order that the specimen position can be corrected with an accuracy of 10% (0.05 µm) or less of the view-field diameter (0.5 µm) at the image pickup magnification, it is necessary that after the specimen position has first been corrected through the specimen stage XY control, an image for XY position measurement is again picked up to measure an XY positional displacement amount and is corrected by an image shift. Here, the XY position correction time is about 1 minute. Then, the magnification is set to 200 k for image pickup and the focus is adjusted finely in advance of image pickup. Since the defocus amount can be assumed to be within ±3 µm range and the focus measurement accuracy in a device image at the 200 k magnification has been estimated to be about 0.5 µm, the ±3 µm range is searched at intervals of 0.5 µm. The number of defocus series images is 13 and so the search time is about 2 minutes. Thus, about 4 minutes are consumed for image pickup in one direction and because of images taken in 18 directions, the rotation series image pickup time is 72 minutes, which are added with 7 minutes consumed before rotation series imaging, eventually being estimated to be 79 minutes or about 1 hour and 20 minutes. In comparison with 10 hours or more consumed for the positional displacement correction during the rotation series image pickup in the prior art, it can be understood that the correction time can be shortened by one order or figure according to the present invention.

In the specimen rotation series image pickup, many images are picked up one by one and therefore a reduction in image pickup TAT is demanded eagerly and the need for the present technique is very high. In addition, this advantage can also lead to a reduction in specimen damage under irradiation of an electron beam and the range of kinds of specimens to which three-dimensional observation is applicable can advantageously be broadened. Further, the present invention can be automated and can be practicable by even unskilled persons.

Other objects, features and advantages of the invention will become apparent from the following description of the embodiments of the invention taken in conjunction with the accompanying drawings.

BRIEF DESCRIPTION OF THE DRAWINGS

FIGS. 8A and 8B are diagrams useful to explain the relation between three-dimensional movement of a specimen due to specimen rotation and a locus of the specimen on an image plane.

FIGS. 16A to 16D are diagrams illustrating screens for setting details of individual conditions.

DETAILED DESCRIPTION OF THE EMBODIMENTS

Embodiment 1

Figure 1:
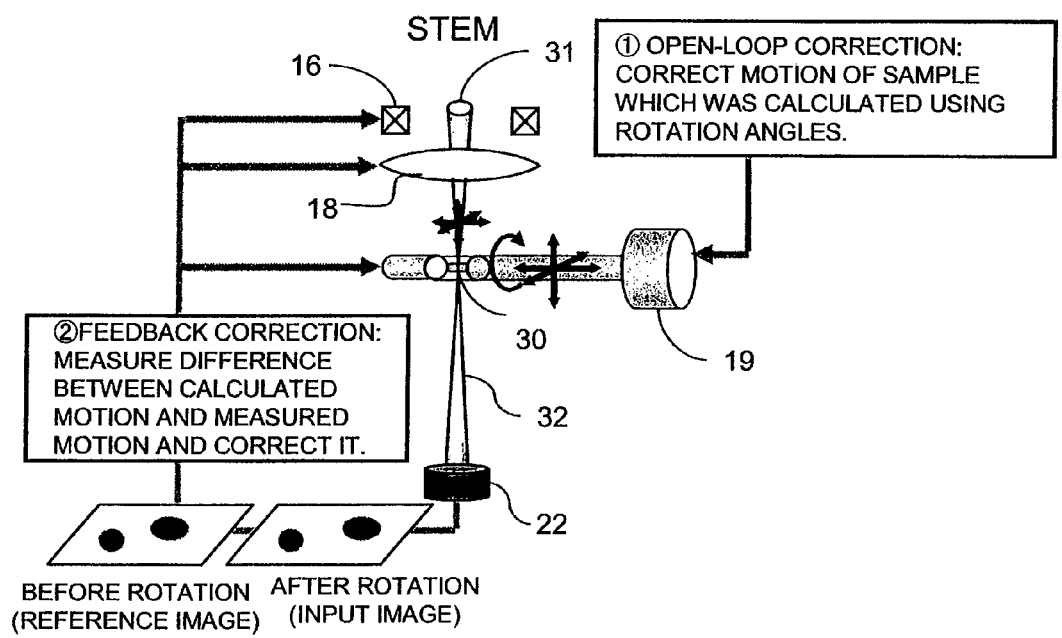
FIG. 1 is a schematic diagram of a system for automatically correcting a specimen movement due to a specimen rotation.

Referring now to FIG. 1, a system is illustrated schematically. The specimen movement due to the specimen rotation is sorted into a repeatable movement due to a shift between the specimen rotation axis and the specimen position and a non-repeatable movement due to mechanical position setting errors of a specimen rotation mechanism and a specimen moving mechanism and corrections appropriate to the respective types will be made. The repeatable movement is corrected through open-loop correction based on records. The non-repeatable movement is corrected through feedback correction in which a specimen movement is measured and corrected by using an image picked up each time the movement takes place. In the open-loop correction, a repeatable movement is modeled, XYZ movement amounts are calculated from a specimen rotation angle and then, control signals necessary to cancel out the XYZ movement amounts are transmitted to any one or more of specimen stage 19, deflection coil 16 and objective lens 18. After the repeatable movement has been corrected through the open-loop correction, a non-repeatable specimen movement amount is cancelled out through the feedback correction. In the feedback correction, a specimen movement is measured and corrected by using an image picked up each time that the movement takes place. An XY movement amount is determined from a positional displacement amount between images before and after the specimen rotation and control signals necessary to cancel out the movement amount are transmitted to any one or more of the specimen stage 19 and deflection coil 16. A shift amount of a specimen 30 from the focal position of electron lens 18 is measured before and after the specimen rotation to measure a Z movement amount and a control signal necessary to cancel out the shift amount is transmitted to any one or more of the specimen stage 19 and objective lens 18.

In preliminary measurement for model estimation, the specimen movement is assumed to be a circular movement around the specimen rotation axis. By measuring XY movement amounts when the specimen is rotated and by fitting model parameters to a locus in XY plane, a three-dimensional model is estimated. The present invention is characteristic of the fact that the Z position is not measured directly but is estimated from the three-dimensional model. The range of non-repeatable movement is determined from the difference between a locus of the estimated model and that of an actually measured locus. The present invention is also characteristic of the fact that the measurement condition for the positional displacement amount in the feedback correction is utilized for setting on the basis of the movement range. By modeling the repeatable movement and by specifying the range of the non-repeatable movement, the positional displacement amount measuring time, especially, the Z position measuring time can be shortened drastically.

Figure 3:
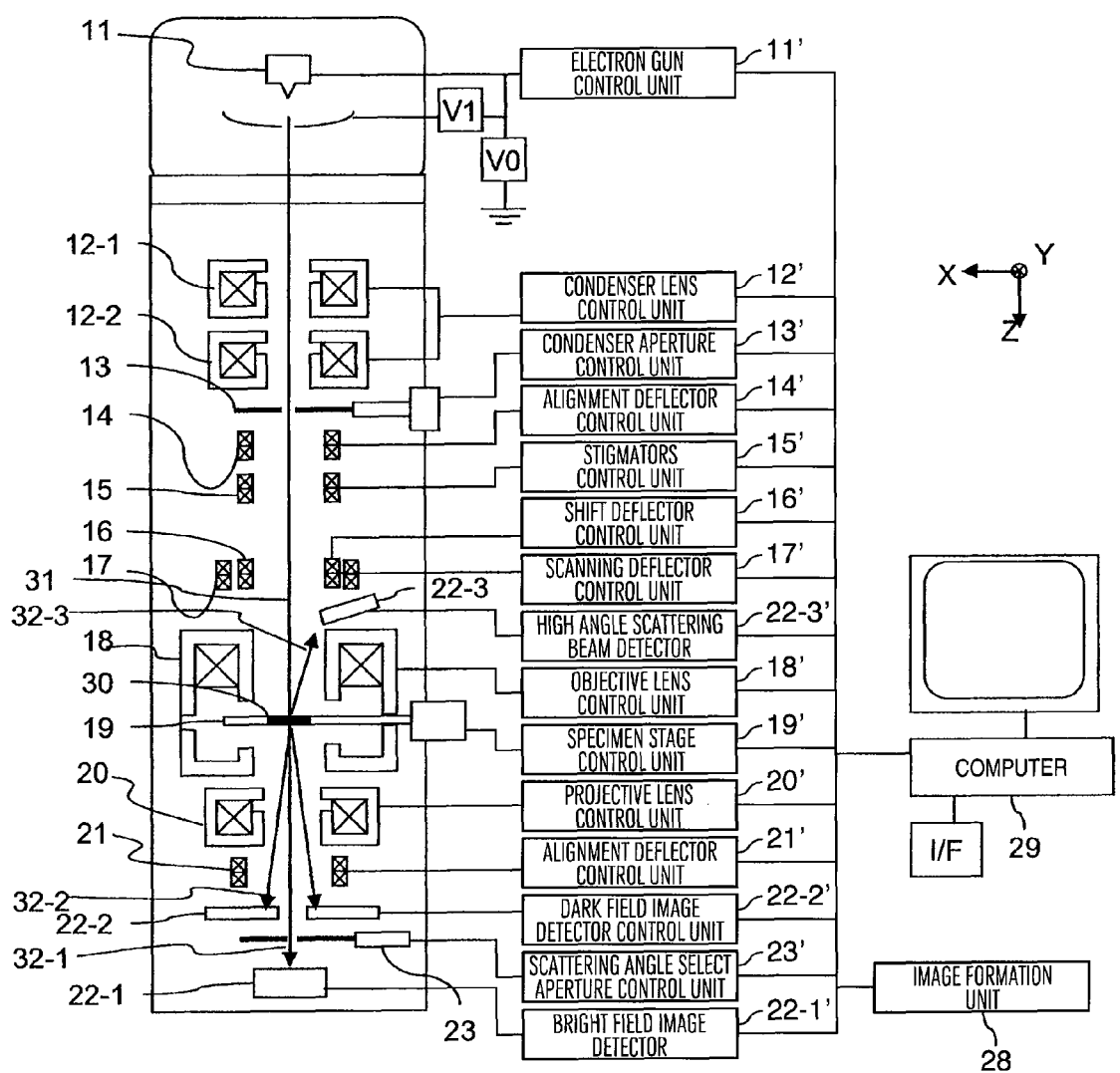
FIG. 3 is a diagram illustrating the fundamental construction of an STEM/SEM.

In the present embodiment, an instance will be described in which a system for correcting a specimen movement due to a specimen rotation is applied to STEM observation of a specimen worked into a projecting shape. The fundamental construction of an STEM/SEM used in the present embodiment is illustrated in FIG. 3. The system comprises an electron gun 11 for emitting a primary electron beam 31, an electron gun control unit 11', a condenser lens 12 for converging the primary electron beam 31, a condenser lens control unit 12', a condenser aperture 13 for controlling the divergent angle of primary electron beam 31, a condenser aperture control unit 13', an alignment deflector 14 for controlling the incidence angle on a specimen 30, an alignment deflector control unit 14', stigmators 15 for correcting the beam shape of the primary electron beam 31 incident on the specimen 30, a stigmators control unit 15', an image shift deflector 16 for adjusting the irradiation area of the primary electron beam 31 incident on the specimen 30, an image shift deflector control unit 16', a scanning deflector 17 for causing the primary electron beam 31 incident on the specimen 30 to raster-scan, a scanning deflector control unit 17', an objective lens 18 for adjusting the focal position of the primary electron beam 31 on the specimen 30, an objective lens control unit 18', a specimen stage 19 for setting the position and rotation angle of the specimen 30 in relation to the incident electron beam 31, a specimen stage control unit 19', an electron detector 22 for detecting an electron beam 32 given off from the specimen 30, an electron detector control unit 22', a projective lens 20 for projecting the electron beam 32 on the electron detector 22, a projective lens control unit 20', an alignment deflector 21 for deflecting the electron beam 32, an alignment deflector control unit 21', a scattering angle select aperture 23 for controlling divergent angle of the electron beam 32, a scattering angle select aperture control unit 23', an image formation unit 28 for forming an STEM/SEM image from an output signal from the electron detector 22 and the raster scan signal, and a computer 29 with control program and image processing program. The individual control units and the image formation unit are controlled by commands from the computer 29. Arranged in the present apparatus are a plurality of electron detectors 22 including a bright field image detector 22-1 adapted to detect a low angle scattering electron beam out of electron rays given off from the specimen 30 forwardly thereof, a dark field image detector 22-2 adapted to detect a high angle scattering beam and a detector 22-3 adapted to detect backscattering electrons and secondary electrons given off from the specimen 30 backwardly thereof. An image formed by electrons given off from the specimen 30 forwardly thereof is called an STEM image and an image formed by electrons given off from the specimen 30 backwardly thereof is called an SEM image. For simplicity of explanation, only the STEM image will be described hereinafter. A direction substantially parallel to the optical axis of the optical column is the Z direction and a plane substantially orthogonal to the optical axis is the XY plane.

Figure 4:
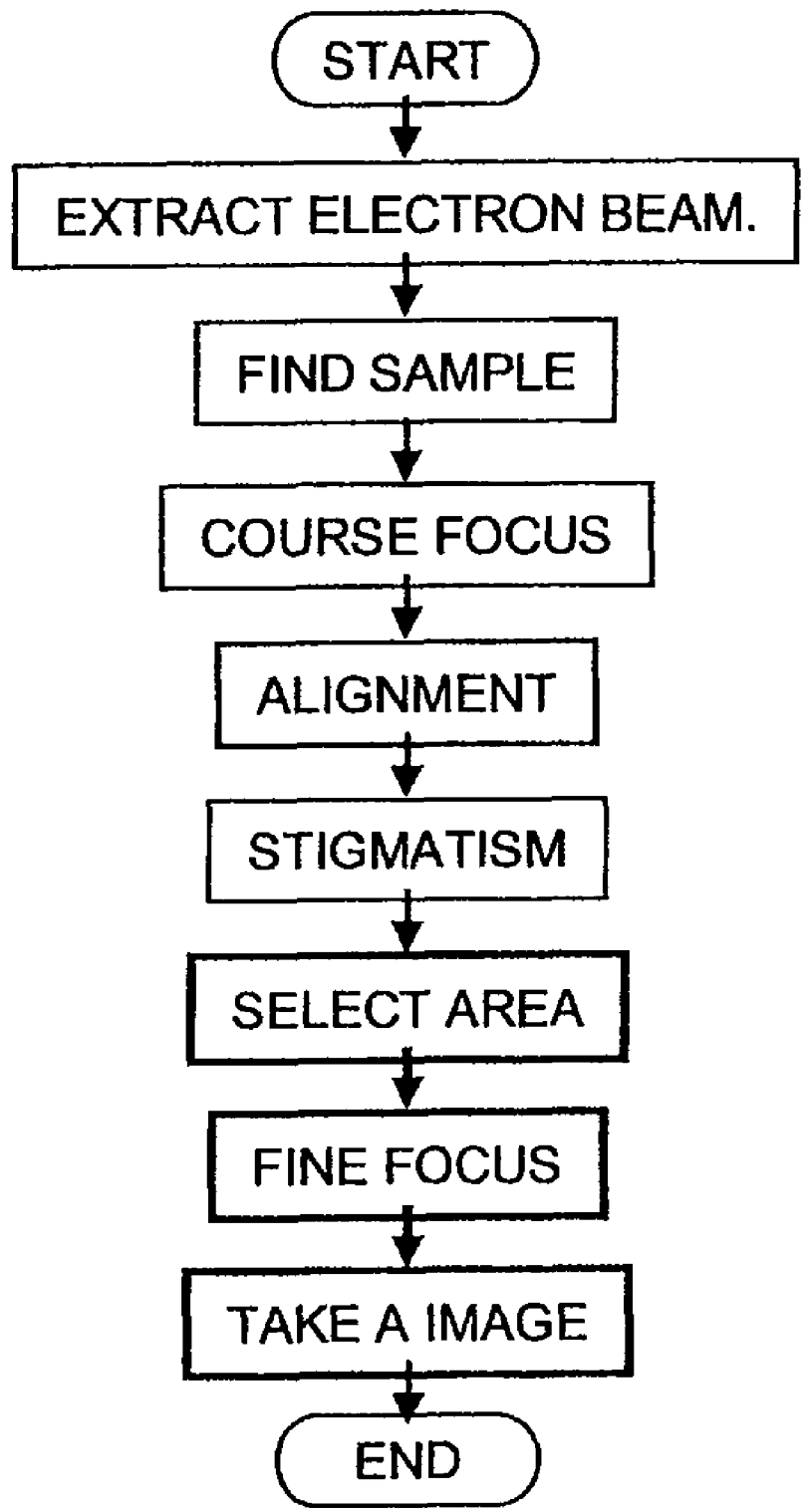
FIG. 4 is a fundamental flow chart of image pickup with the electron microscope.

General procedures of taking an STEM image by using the apparatus of FIG. 3 will be described with reference to FIG. 4. A primary electron beam 31 is extracted from the electron gun 11 with extraction voltage V1 and then an accelerating voltage V0 is applied to the beam. An STEM image is formed by causing the primary electron beam 31 converged to a spot of nm order by means of the condenser lens 12 to raster-scan on the specimen 30 by means of the scanning deflector 17, detecting an electron beam 32 given off from the specimen 30 under irradiation of the primary electron beam 31 and synchronizing an output signal from the electron detector 22 with a raster-scan signal of the scanning deflector 17. Firstly, the extraction of primary electron beam 31 is confirmed with the electron detector 22. A thin-film specimen 30 is mounted on the specimen stage 19 and admitted to the specimen chamber and then, the position of the specimen is confirmed by using its STEM image at low magnification. The magnification for the STEM image is set within the range of scanning of raster-scan performed by the scanning deflector 17. The position of the specimen 30 is adjusted by using the specimen stage 19 and the magnification is increased, selecting a view-field for adjustment of the electron optical system. After making rough focus correction by controlling the Z position of specimen stage 19 and the objective lens 18 as well, misalignment of the primary electron beam 31 is corrected. An image shift when the focus of objective lens 18 is changed is detected and the aperture position of objective aperture 13 or the control value of alignment deflector 21 is adjusted such that the image shift is minimized. After completion of the alignment correction, an astigmatic aberration is corrected. The objective lens 18 is focused on the specimen 30 and thereafter, a change in image is observed when changing the focal point of the objective lens 18 and then stigmators 15 are so adjusted as to cause the image to change in an isotropic fashion. After the astigmatism correction, an image pickup view-field is selected and the focus of objective lens 18 is adjusted finely, followed by taking an STEM image.

Figure 5:
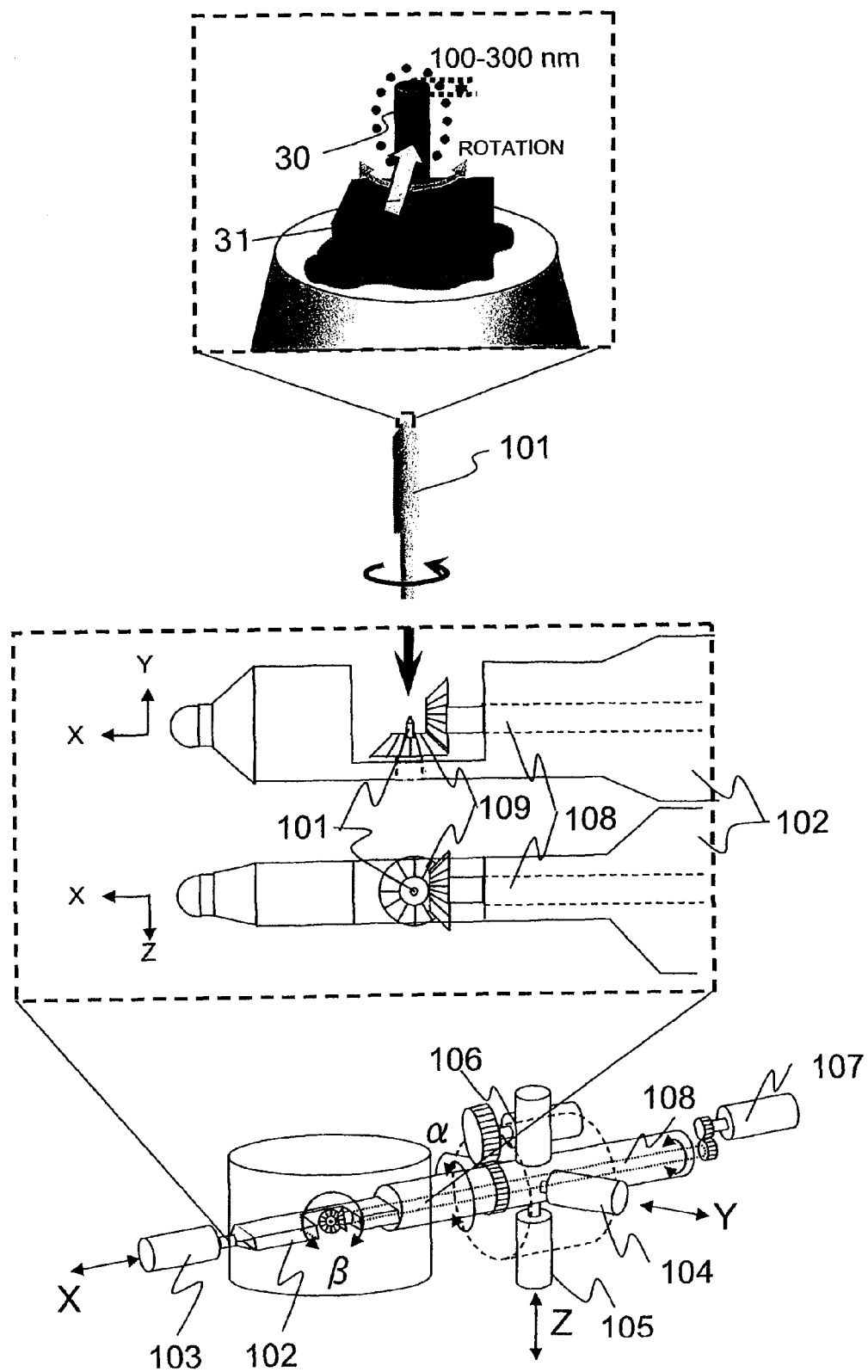
FIG. 5 is a diagram showing the fundamental construction of a projecting specimen pedestal, a specimen holder and a specimen stage.

In the three-dimensional structure analysis, images acquired through observation of a specimen in various directions are needed and therefore, a specimen 30 worked to a projecting shape as shown in FIG. 5 is used. For details of the work of specimen, reference is to be made to Japanese Patent No. 3677895. The projecting specimen 30 is mounted to a uniaxial all-direction rotational specimen holder 102 while making the projection center axis coincident with the specimen rotation axis. The specimen size is µm order and direct handling of the specimen is difficult. Accordingly, the specimen 30 is fixed on a needle type carrier 101 and the needle type carrier 101 is mounted to the specimen holder 102. By using the needle type carrier 101, the projecting specimen can be mounted/dismounted while coinciding the direction of rotation axis of the specimen holder 102 with the direction of center axis of the projecting specimen. The needle type carrier 101 can be used in combination with a different work device such as FIB device and a different observation apparatus such as SEM or TEM and after being worked and observed with the different device and apparatus, the projecting specimen can again be observed with the FIG. 3 apparatus. Further, the specimen holder 102 per se shown in FIG. 5 can be used in combination with the other work device and observation apparatus. When alternately repeating specimen work by the FIB and confirmation of worked state by the STEM, the procedure can proceeds efficiently with the same specimen holder 102 used.

The specimen holder 102 mounted with the specimen 30 is admitted to the specimen stage. A moving mechanism and a rotation mechanism which are used for the specimen stage are shown in FIG. 5. Positions in X, Y and Z directions of the specimen are controlled by three linear actuators 103 to 105 each comprised of a pulse motor and an encoder (not shown). A unit of control of a specimen movement by the linear actuator is set to about 1 nm/pulse but because of generation of backrush and lost movement at a junction of the linear actuator with the specimen holder, the error in positioning is degraded to about 1 µm. The specimen rotation is controlled by an α pulse motor 106 adapted to rotate the whole of specimen holder 102 about the X axis and a β pulse motor 107 adapted to rotate a jig 108 inside the specimen holder. Rotation of the β pulse motor 107 is transmitted to a bevel gear 109 through the medium of the jig 108 inside the specimen holder to rotate the specimen pedestal 101 connected to the bevel gear 109. A unit of control of the specimen rotation is also set to about 0.01°/pulse but because of generation of backrush and lost movement at junctions of the motor, jig and gear, the error in setting the angle of specimen is degraded to about 1°.

Figure 6:
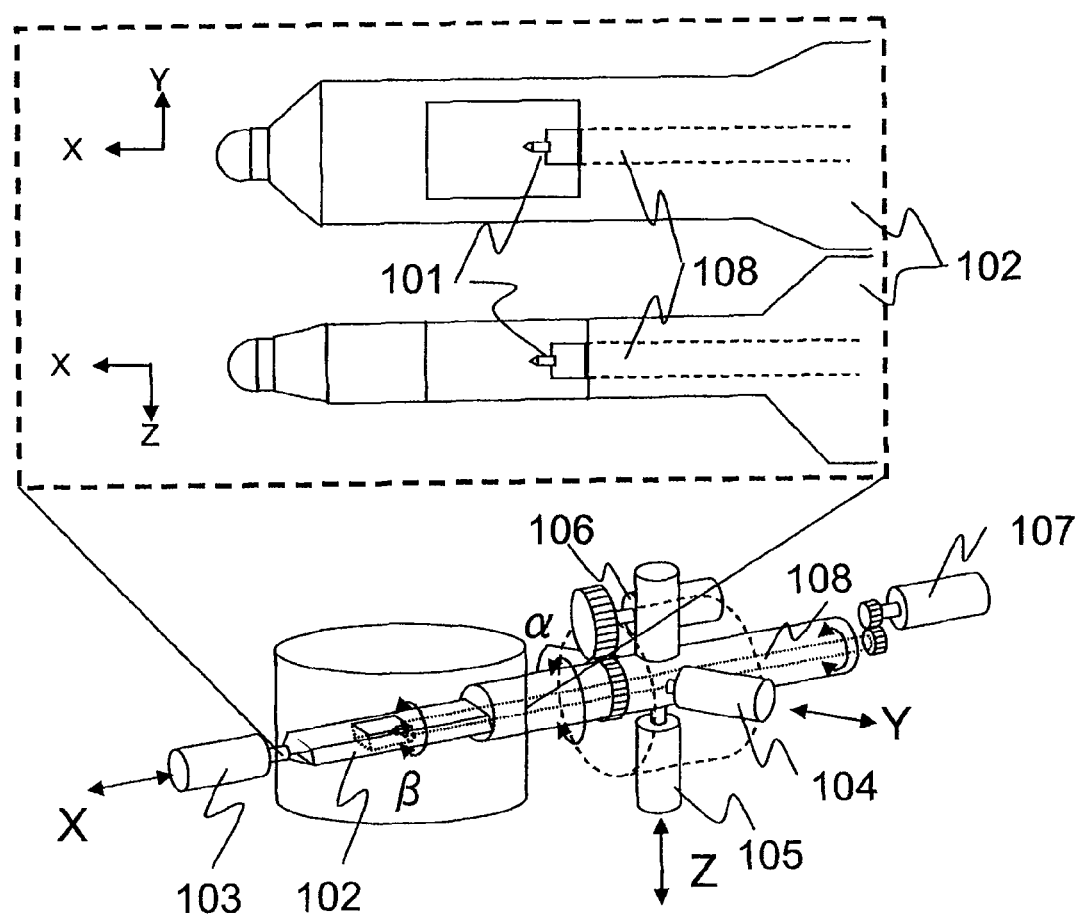
FIG. 6 is a diagram showing the fundamental construction of another example of specimen holder for projecting specimen and specimen stage.
Figure 7:
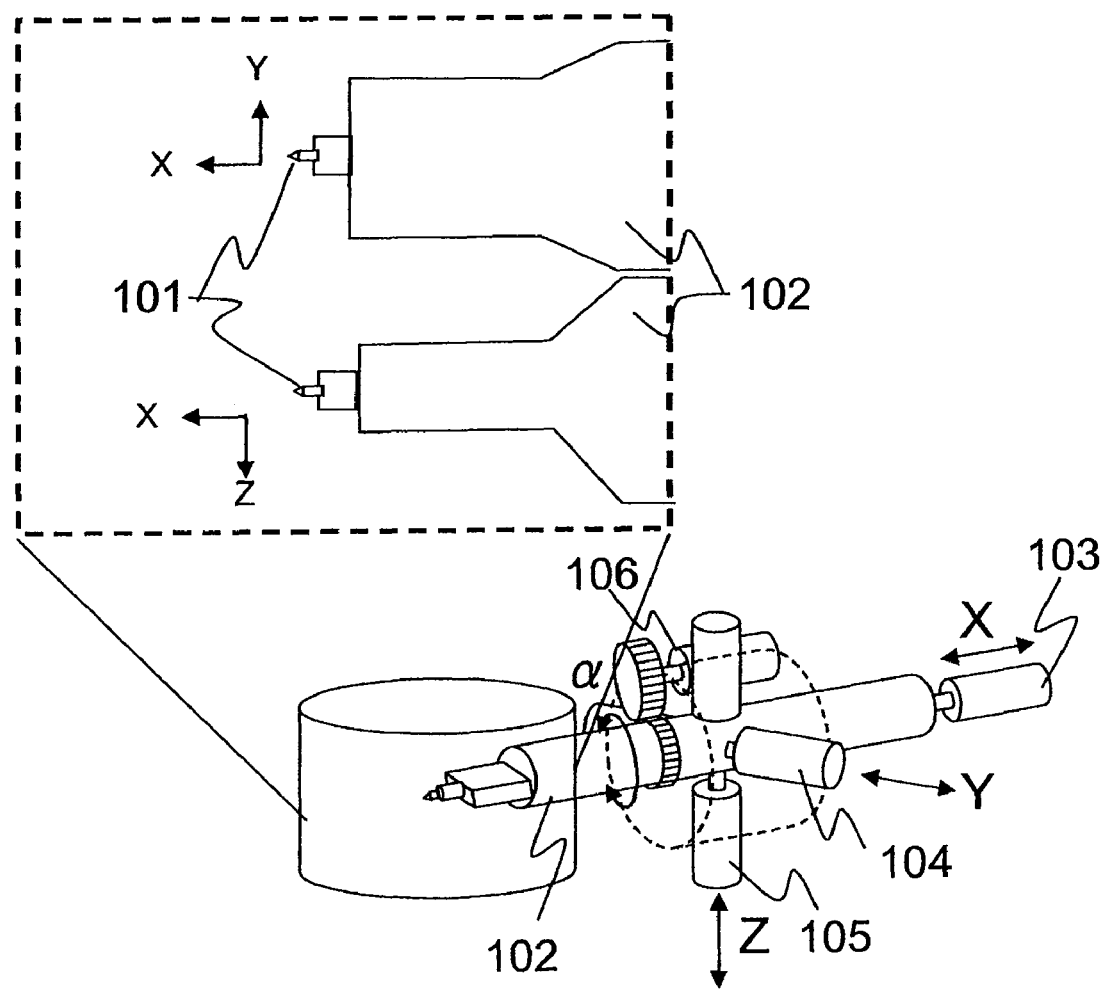
FIG. 7 is a diagram showing the fundamental construction of still another example of specimen holder for projecting specimen and specimen stage.

Illustrated in FIGS. 6 and 7 are other structures of uniaxis all-direction rotational specimen holder than the FIG. 5 structure. In FIG. 6, the XYZ movement mechanism is the same as that in FIG. 5 but the specimen rotation mechanism differs. More particularly, in FIG. 6, a needle type carrier 101 mounted with a projecting specimen 30 is inserted in the tip of a jig 108. The jig 108 inside the specimen holder is rotated about the X axis by means of a β pulse motor 107 and the projecting specimen 30 is rotated about the X axis. In FIG. 7, a YZ movement mechanism is the same as that in FIG. 5 but an X movement mechanism and a specimen rotation mechanism differ from those in FIG. 5. Linear actuators 103 to 105 for XYZ movements are arranged on the same side of the optical axis of electron microscope and a specimen holder 102 is cantilevered. For specimen rotation, the whole of specimen holder 102 is rotated by using the a motor 106, thus rotating the projecting specimen 30 about the X axis. Performances of the respective specimen holders will be compared with one another. Comparing the sizes of rotary members for transmission of rotation to the specimen 30, bevel gear 109 (FIG. 5)<jig 108 (FIG. 6)<specimen holder 102 (FIG. 7) stands. As the size of the rotary member decreases, the influence the accuracy of working of the parts has upon the axis whirling increases. Accordingly, for axis whirling amount of the rotary shaft, FIG. 5>FIG. 6>FIG. 7 is expected. Next, the specimen drift amount will be examined. If individual parts of the specimen holder are clamped by a plurality of members, the specimen drift can be decreased. In connection with X direction, in the case of FIG. 5, the specimen holder 102 is clamped by the atmospheric pressure and the motor 103 and the jig 108 is clamped by the atmospheric pressure and the bevel gear 109; in the case of FIG. 6, the specimen holder 102 is clamped by the atmospheric pressure and the motor 103 but the jig 108 is cantilevered; and in the case of FIG. 7, both the specimen holder 102 and the jig 108 are cantilevered. Accordingly, in connection with the specimen drift amount in X direction, FIG. 5<FIG. 6<FIG. 7 is expected. In consideration of the fact that the shaft whirling amount can be suppressed to 1° or less in even the structure of FIG. 5 owing to improvements in fine working technique, that vulnerability to the influence the drift has is high because the specimen is observed at high magnification and that wait time until the drift converges is desired to be shortened for the sake of shortening the TAT, the structure of specimen stage and specimen holder of FIG. 5 is adopted in the present embodiment.

By using the above apparatus, a series of specimen rotation images are taken. Image pickup procedures are outlined in FIG. 2. In step 1, a movement of a specimen due to its rotation is measured preliminarily. In step 2, from the results of the preliminary measurement in step 1, a model of repeatable movement and a range of non-repeatable movement are determined. In the rotation series image pickup, the repeatable movement is corrected through open-loop correction and the non-repeatable movement is corrected through feedback correction. In step 3, images to be recorded as rotation series images are taken. If an image pickup at another rotation angle is necessary, an image before specimen rotation is taken at a magnification for specimen position measurement (step 4) and thereafter, the specimen is rotated (step 5). In step 6, a repeatable specimen movement is calculated from the specimen rotation angle and the model and the specimen position is corrected such that the movement can be cancelled out (open-loop correction). In step 7, an image after the specimen rotation is taken at the specimen position measurement magnification and an amount of a positional displacement from the image taken before the specimen rotation is measured and corrected (feedback correction). Then, images to be recorded as rotation series images are taken (step 3). Thereafter, the procedure of steps 3 to 7 is repeated until images at all rotation angles are taken.

Details of the respective steps will be described hereunder. In the step 1, preliminary measurement of a specimen movement due to a specimen rotation is executed. Procedures of measuring the amount of specimen movement are diagrammatically illustrated in FIG. 9. An appropriate area of an image at a rotation angle (at (A) in FIG. 9) is registered as a reference pattern (at (B) in FIG. 9). Preferably, an area less deformable through the specimen rotation may be selected as the reference pattern. Since in the present embodiment the specimen 30 worked into a projecting shape is used, the projecting portion is selected. Preferably, the specimen rotation angle may be set in consideration of a pattern deformation. In the present embodiment, the specimen rotation angle is graduated at intervals of 20°. Then, in an image after the specimen rotation (at (C) in FIG. 9), a pattern search is carried out to measure an amount of movement of the projecting portion.

For the pattern search, the use of the normalized mutual correlation method or the method of least squares, which is capable of enabling the search even if the pattern is deformed slightly, is recommended. After the pattern search, a searched area is registered as a new reference pattern (at (D) in FIG. 9) and subsequently, a pattern search is executed similarly in an image at the next rotation angle (at (E) in FIG. 9) so as to measure an amount of positional displacement of the projecting portion.

In image processing, the pattern will sometimes be searched erroneously. Accordingly, the result of search is displayed in the form of a square frame 110 or a cruciform mark to make confirmation as to whether the pattern is searched correctly. In addition, in order that an image disabled for pattern search can be noticed, a warning message can be displayed. In the normalized mutual correlation method or the method of least squares, the degree of coincidence between patterns can be evaluated by a correlative value and therefore, if the correlative value falls below a threshold in the normalized mutual correlation method or exceeds a threshold value in the method of least squares, the positional displacement measurement is stopped and a message purporting that the possibility of disabled pattern search is high is displayed (at (E) in FIG. 9). The pattern search result is confirmed and if necessary, the search result is corrected (at (F) in FIG. 9). A corrected area is registered as a reference pattern (at (G) in FIG. 9) and the positional displacement amount measurement is resumed.

The measurement of the movement amount of projecting portion may be carried out after all images are taken and recorded or each time that an image is taken. Execution of locus measurement after all images have been taken has an advantage that some of setting conditions including reference pattern area can be examined in trail. The pattern search can be optimized through examination of a condition for carrying out the pattern search stably. This is suitable for a specimen having a structure for which observation is experienced infrequently. On the other hand, execution of the pattern search each time that an image is taken has an advantage that the image save time can be shortened and the processing time can be shortened. This is suitable for a specimen having a structure for which observation has already been carried out many times.

The preliminary measurement in the step 1 needs to be executed at low magnification. Since the amount of specimen movement due to the specimen rotation will sometimes amount to several of tens of μm, the preliminary measurement is executed at a magnification of 2 k (view-field diameter being 50 μm) in the present embodiment. For a specimen from which a feature pattern used for the positional displacement measurement cannot be observed at the low magnification, specimen movement amount measurement as below can be used. More specifically, a method is employed according to which after the magnification is increased to permit the feature pattern to be observed, a specimen is returned by means of the specimen movement mechanism in such way that the specimen is rotated gradually to cancel out a specimen movement amount due to specimen rotation and the amount of return is recorded. In this method, however, an error in positioning the specimen movement mechanism interferes the measurement result and so another method is selected in which the locus of a specimen is measured at low magnification without moving the specimen movement mechanism.

Figure 10:
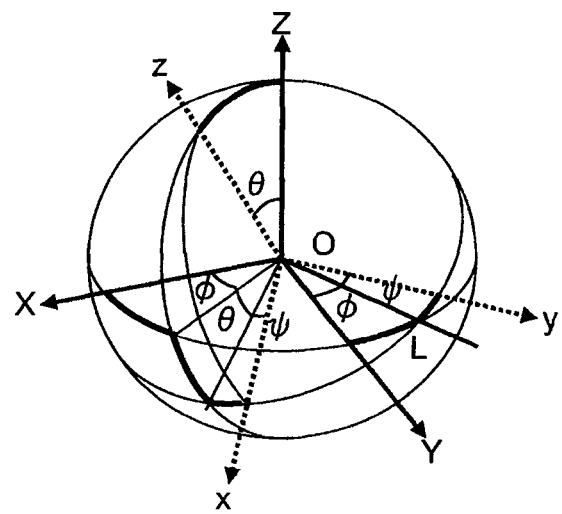
FIG. 10 is a diagram for explaining Eulerian angles between Cartesian coordinate system XYZ and Cartesian coordinate system xyz.

In step 2, from the result of preliminary measurement obtained in the step 1, a repeatable movement model and a range of non-repeatable movement are determined. The repeatable movement is defined as a geometrical movement generated owing to separation of the specimen position from the specimen rotation axis (see FIG. 8A) and the non-repeatable movement is defined as a movement attributable to lost motion and backrush generated in the specimen rotation mechanism (see FIG. 8B). As the specimen movement model, a circular motion about the specimen rotation axis is assumed (FIG. 8A). The Cartesian coordinate system fixed on the electron microscope is represented by XYZ and the Cartesian coordinate system fixed on the specimen pedestal is represented by xyz. The two coordinate systems can be related to each other by Eulerian angles (see FIG. 10). The coordinate transformation between the coordinate system XYZ and the coordinate system xyz can be expressed by using Eulerian angles (θ, φ, ϕ):

$$\begin{bmatrix} X \\ Y \\ Z \end{bmatrix} = \qquad (1)$$

-continued $$\begin{bmatrix} \cos\psi\cos\phi\cos\theta - \sin\psi\sin\phi & -\sin\psi\cos\phi\cos\theta - \cos\psi\sin\phi & \cos\phi\sin\theta \\ \cos\psi\sin\phi\cos\theta + \sin\psi\cos\phi & -\sin\psi\sin\phi\cos\theta + \cos\psi\cos\phi & \sin\phi\sin\theta \\ -\cos\psi\sin\theta & \sin\psi\sin\theta & \cos\theta \end{bmatrix}$$

$$\begin{bmatrix} x \\ y \\ z \end{bmatrix}$$

In equation (1), an angle the z axis makes to Z axis is represented by θ and angles a line OL at which XY plane intersects xy plane make to y axis and Y axis are represented by φ and ϕ, respectively. When describing a specimen position on the coordinate system xyz as $(x,y,z)=(r\cdot\cos\beta, r\cdot\sin\beta, 0)$, a specimen position on the coordinate system XYZ is expressed by:

$$\begin{bmatrix} X \\ Y \\ Z \end{bmatrix} = \quad (2)$$

$$\begin{bmatrix} \cos\psi\cos\phi\cos\theta - \sin\psi\sin\phi & -\sin\psi\cos\phi\cos\theta - \cos\psi\sin\phi & \cos\phi\sin\theta \\ \cos\psi\sin\phi\cos\theta + \sin\psi\cos\phi & -\sin\psi\sin\phi\cos\theta + \cos\psi\cos\phi & \sin\phi\sin\theta \\ -\cos\psi\sin\theta & \sin\psi\sin\theta & \cos\theta \end{bmatrix}$$

$$\begin{bmatrix} r\cos\beta \\ r\sin\beta \\ 0 \end{bmatrix} = \begin{bmatrix} r\cos\phi\cos\theta\cos(\beta+\psi) - r\sin\phi\sin(\beta+\psi) \\ r\sin\phi\cos\theta\cos(\beta+\psi) + r\cos\phi\sin(\beta+\psi) \\ -r\sin\theta\cos(\beta+\psi) \end{bmatrix}$$

To XY positions at respective β measured in step 1, θ, φ, ϕ and r are fitted. Here some presumptions for stabilizing fitting are introduced. Structurally, the specimen holders shown in FIGS. 5, 6 and 7 are symmetrical to the XY plane. Then, it is assumed that the specimen rotation axis z exists in the XY plane. For θ=90°, equation (2) is transformed to:

$$\begin{bmatrix} X \\ Y \\ Z \end{bmatrix} = \begin{bmatrix} -\sin\psi\sin\phi & -\cos\psi\sin\phi & \cos\phi \\ +\sin\psi\cos\phi & +\cos\psi\cos\phi & \sin\phi \\ -\cos\psi & \sin\psi s & 0 \end{bmatrix} \quad (3)$$

$$\begin{bmatrix} r\cos\beta \\ r\sin\beta \\ 0 \end{bmatrix} = \begin{bmatrix} -r\sin\phi\sin(\beta+\psi) \\ r\cos\phi\sin(\beta+\psi) \\ -r\cos(\beta+\psi) \end{bmatrix}$$

Whether the assumption is reasonable or not can be decided by whether the locus of XY movement can be approximated by a linear line (at (A) in FIG. 11). Further, it can be assumed that in the specimen holders structured as shown in FIGS. 6 and 7, respectively, the specimen rotation axis is parallel to X axis. Then, by assuming θ=90° and ϕ=0°, equation (3) is transformed to $$\begin{bmatrix} X \\ Y \\ Z \end{bmatrix} = \begin{bmatrix} 0 & 0 & 1 \\ \sin\psi & \cos\psi & 0 \\ -\cos\psi & \sin\psi s & 0 \end{bmatrix} \begin{bmatrix} r\cos\beta \\ r\sin\beta \\ 0 \end{bmatrix} = \begin{bmatrix} 0 \\ r\sin(\beta+\psi) \\ -r\cos(\beta+\psi) \end{bmatrix} \quad (4)$$

By selecting a model of equation (3) or a model of equation (4) in accordance with the specimen holder, parameters can be fit. In fitting, the method of non-linear least squares is used. Depending on the structure of specimen holder, another model will sometimes fit and the model selection is to be executed appropriately.

Figure 11A:
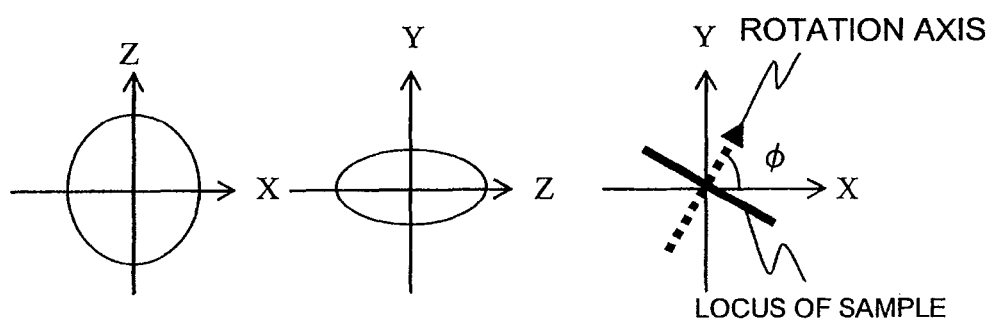
FIGS. 11A and 11B are diagrams useful to explain the relation between a direction of the specimen rotation axis and a specimen movement due to a specimen rotation.
Figure 11B:
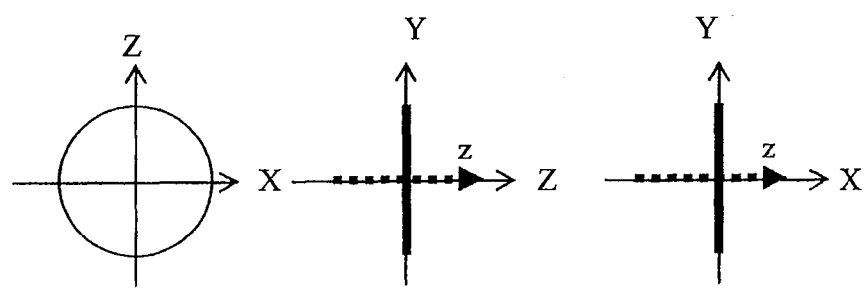
Figure 12A:
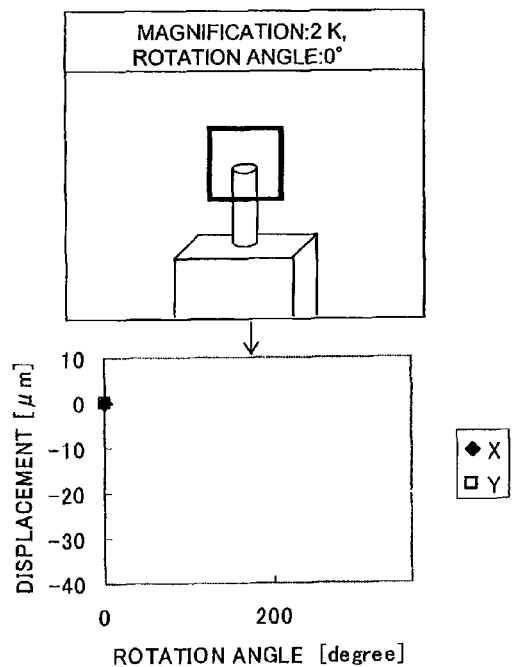
FIGS. 12A to 12C are diagrams illustrating an example of measurement of specimen movement due to specimen rotation.
Figure 12B:
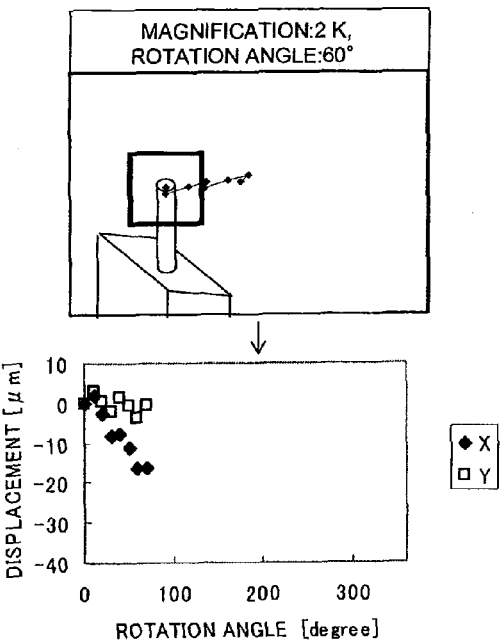
Figure 12C:
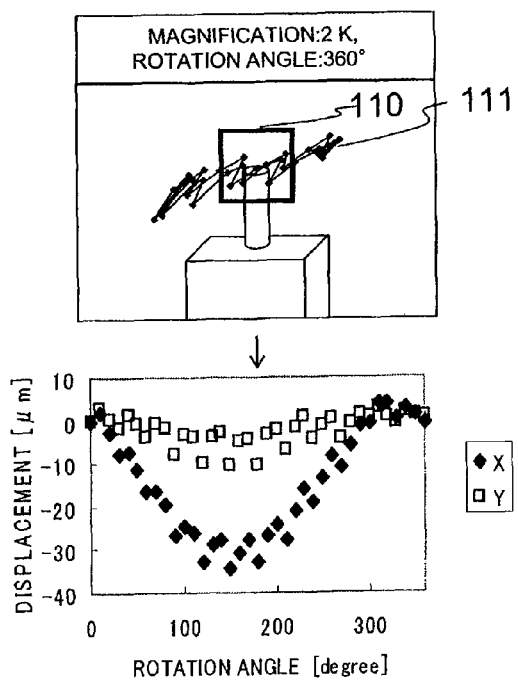

Turning now to FIGS. 12A to 12C, an example of measurement of specimen movement due to specimen rotation will be described. A reference pattern is selected at β=0° as shown in FIG. 12A and specimen movements due to specimen rotation are measured as shown in FIG. 12B until β=360° is reached as shown in FIG. 12C. It will be seen that the XY locus 202 is approximated by a linear line and so the specimen rotation axis z exists in the XY plane. Since the specimen rotation causes a movement to proceed in Y direction in phase with that in X direction, attainment of fitting to a model as shown in FIG. 11A and indicated by equation (3) can be seen. Through parameter fitting, ϕ, φ and r are determined and amounts of specimen movement due to the specimen rotation are calculated.

Figure 13A:
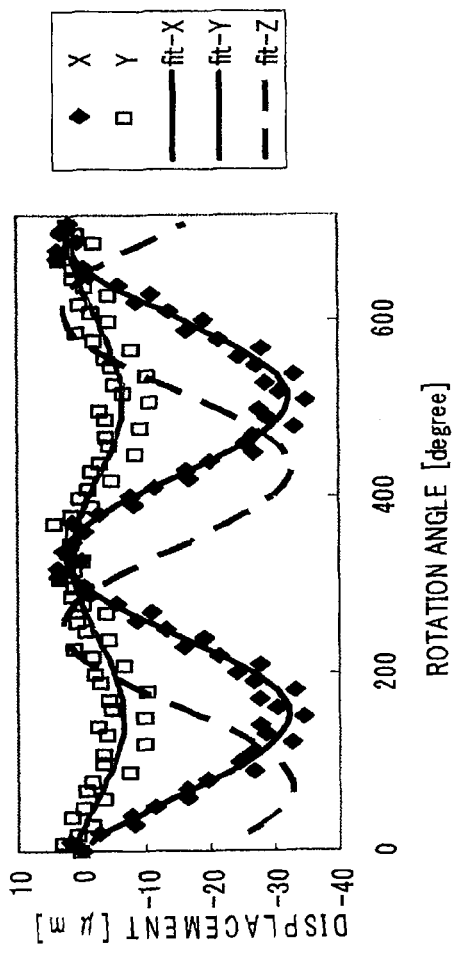
FIGS. 13A and 13B are diagrams illustrating an example of analysis of the locus of specimen movements.
Figure 13B:
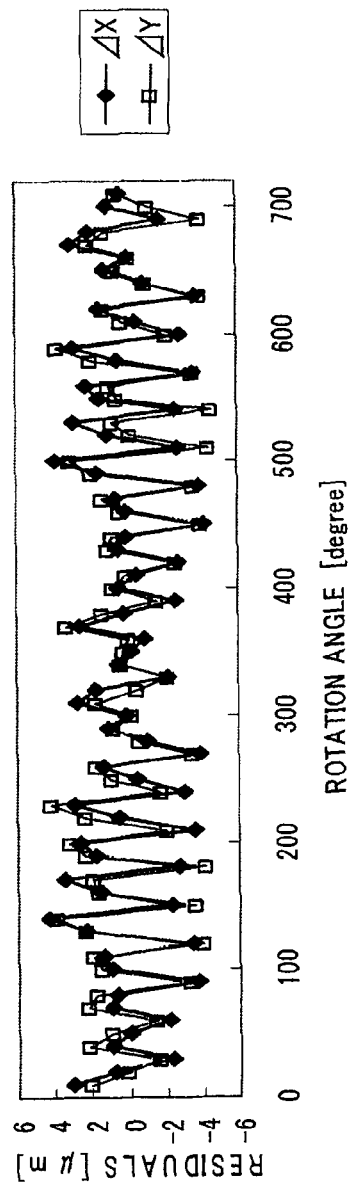

A locus of the measured XY movements and a locus of XYZ movements calculated from the model are illustrated in FIG. 13A. The measurement result substantially coincides with the locus of the model, proving that repeatable movements can be described by using the model. In FIG. 13B, the difference between the measurement result and the model locus is illustrated to indicate non-repeatable movements affected by backrush and lost motion. It will be seen that the residual changes periodically at a period of 30°. Further, as will be seen from the figures, the residual being ±2 μm and ±4 μm near 0° and 180°, respectively, shows that the magnitude of residual changes at a period of 360°. Presumably, such a residual as above will depend on the structures of specimen stage and specimen holder. The results shown in FIGS. 13A and 13B originate from measurement using the specimen stage and holder structured as shown in FIG. 5. In the FIG. 5 specimen holder, the rotation of motor 107 is transmitted to the specimen via the bevel gear 109. The bevel gear 109 has a pitch of 30° and presumably, in the change at 30° period, the residual will increase when the engagement of the gear changes from one to another. Then, the change at 360° period will presumably be caused under the influence of the eccentricity of the bevel gear. When the specimen is rotated twice, residuals in the first and second rotations showed substantially the same tendency. In connection with displacement from a circular motion, if high repeatability can be confirmed, the positional displacement can be determined as repeatable and modeled so as to be used for open-loop correction.

In step 3, image pickup of a series of rotation images is started. Prior to describing the rotation series image pickup, a method of measuring an amount of defocus will be explained. Available as the specimen defocus amount measuring method are a method utilizing parallax and a method utilizing an evaluation value of sharpness degree of an image. In the STEM, a focus correction method utilizing the sharpness evaluation value is used frequently. This is because the parallax becomes zero at a just focus in the TEM whereas the view-field shifts even at a just focus in the STEM when the incident angle of an electron beam is changed. But, as well known in the art, the defocus amount ΔF is proportional to view-field shift amount D. The focus correction based on the parallax is carried out in accordance with procedures as below. More particularly, prior to specimen rotation, the focus is corrected manually and a specimen shift amount D0 at a just focus is measured. By changing the focus by a known amount ΔF1, a view-field shift amount D1 is measured and a proportional coefficient a between ΔF1 and (D1−D0) is determined. Thereafter, a defocus amount ΔF=a(D−D0) is determined from a specimen shift amount D and the focus is corrected automatically. For more details, reference is to be made to JP-A-2002-134048. On the other hand, the method utilizing the sharpness evaluation value can automatically measure a shift amount from the just focus but is disadvantageous in that a series of through-focus images are needed and the measurement time is prolonged. In the present embodiment aiming at improvements in the TAT, the defocus amount will be measured through steps as described below. Firstly, prior to rotation series image pickup, a specimen is brought into a just focus by utilizing a sharpness evaluation value. At the just focus, a view-field shift amount D0 and if necessary, a proportional coefficient a between the focus shift amount and the view-field shift amount are measured. Subsequently, a Z movement amount due to specimen rotation, that is, a defocus amount is determined by taking a pair of images when the incident angle of the electron beam is changed, determining a view-field shift amount D and transforming the shift amount D to a defocus amount. In case the STEM in use is not added with the function to measure the parallax, the defocus amount is measured and corrected through the method utilizing the sharpness evaluation value. After the defocus amount measurement method has been selected and necessary parameters have been measured, a rotation series image pickup operation is started. Firstly, in step 3, the magnification is set to a value for image pickup, for example, 200 k and the focus is adjusted finely and thereafter, an image used for the rotation series image is taken.

In step 4, an image before specimen rotation is taken at the magnification for specimen position measurement. The specimen position measurement magnification is set on the basis of the range of non-repeatable positional displacement obtained in the step 2 and the magnification of images recorded as the rotation series images. For example, when the positional displacement range is ±4 μm and the accuracy of positioning specimen stage XY movement is ±1 μm, the error in open-loop correction is estimated to be ±5 μm. Accordingly, it is necessary that the view-field diameter for positional displacement measurement image be ±5 μm or more (magnification being 10 k or less). On the other hand, on the assumption that the positional displacement amount permissible for the rotation series image pickup is 10% or less of the view-field diameter for images to be taken, [10% of view-field diameter for image pickup]>[[position measurement error]=[error in measurement of positional displacement amount (the number of pixels)]×[pixel size of position measurement image]=[error in measurement of positional displacement amount (the number of pixels)]×([view-field diameter of position measurement image]/[pixel number of position measurement image]) is held. When the image pickup magnification is 200 k (view-field diameter being 0.5 μm), the error in measurement of positional displacement amount is 1 pixel and the number of pixels for position measurement image is 500×500, the view-field diameter of position measurement image is so calculated as to necessarily be [10% of view-field diameter for image pickup]×[pixel number of position measurement image]/[error in measurement of positional displacement amount (pixel number)]=0.05 μm×500 pixels/1 pixel]=25 μm or less (a magnification being 4 k or more). Gathering from the above examination, the magnification for position measurement image must be within the range of 4 k to 10 k. Here, because of the diameter of projecting specimen 30 being small amounting to several 100 nm, the pattern search is considered as being stabilized by taking an image at high magnification and so, the magnification for position measurement image is set to 10 k (view-field diameter being 10 μm). If the error in open-loop correction is large and besides rotation series images need to be taken at high magnification, images for positional displacement measurement must be taken at a plurality of magnifications and feedback correction must be executed in multiple steps. For example, when the open-loop correction error is ±10 μm and the magnification for image pickup is 500 k, measurement image magnifications of 5 k or less and 10 k or more are required by taking into account the correction error and the image pickup magnification, respectively. The magnification meeting the above two requirements do not exist and therefore, the first feedback correction is made at a magnification of 5 k and subsequently, the second feedback correction is made at a magnification of 50 k.

In step 5, the specimen is rotated and in step 6, a repeatable specimen movement is calculated from a specimen rotation angle and the model as well and the specimen position is so corrected as to cancel out that movement (open-loop correction). An angle β1 before the specimen rotation is inputted to the model to determine a position (X1, Y1, Z1) before rotation and an angle β2 after the rotation is inputted to the model to determine a position (X2, Y2, Z2) after the rotation, thus calculating an amount of movement (ΔX, ΔY, ΔZ) of the specimen due to the specimen rotation. The specimen is moved using the specimen stage so that the difference movement may be cancelled out. The amount of positional displacement due to the specimen rotation does not depend on from what degree the rotation has proceeded but depends on from what degree to what degree the rotation has proceeded. Accordingly, for the open-loop correction, the position at which the specimen rotation angle is zero must be fixed. On the other hand, in the rotation series image pickup, it is convenient for confirmation of the image pickup state that the position at which the specimen rotation angle is zero can be reset as necessary. Accordingly, apart from the rotation angle β used for the open-loop correction, a rotation angle β' to be displayed on the screen during rotation series image pickup may preferably be provided.

In step 7, an image for positional displacement measurement is taken for the sake of making feedback correction and a residual amount of positional displacement failing to be corrected through open-loop correction is measured and corrected. Firstly, the Z position, that is, the defocus amount correction is performed. An image pickup condition when the measurement method utilizing parallax is used will be examined. Where the incident angle change is 10 mrad and the accuracy of measurement of positional displacement amount is 0.5 pixel, the accuracy of Z position measurement at a magnification of 10 k (pixel size being 20 nm) is 1 μm, which is smaller than the positioning accuracy ±3 μm for specimen stage Z movement. Next, an image pickup condition in the case of the measurement method utilizing the sharpness evaluation value will be examined. The image pickup condition for through-focus series images is set on the basis of the range of non-repeatable movement determined in step 2 and the accuracy of positioning of specimen stage Z movement. For example, the example of measurement as shown in FIGS. 13A and 13B will be examined. Since the amount of specimen movement due to specimen rotation in Z direction can be assumed to substantially equal that in Y direction, the positional displacement range in Z direction can be estimated to be ±4 μm as is the case of that in Y direction. If the accuracy of positioning of specimen stage Z movement is ±3 μm, the correction error in open-loop correction can be estimated to be about ±7 μm. Therefore, the range of through-focus series images is set to ±9 μm and the step width is set to 3 μm which is half the Z stage position positioning accuracy. After the defocus amount has been measured, the specimen position is brought into the objective lens focal position by means of the Z stage.

The shift amount between the objective lens focal position and the specimen position can be cancelled out in two manners. Namely, there are a method of changing the specimen position by using the specimen stage Z movement and a method of changing the focus by changing the excitation current of the objective lens. In the specimen movement by specimen stage Z control, the setting accuracy of position is low but the work range is wide. On the other hand, in the focus shift by the objective lens excitation current, the positioning accuracy is high but when the focal position changes largely, such inconveniences arise including change of the image magnification and rotation of the image about the optical axis. In the apparatus used in the present embodiment, with the focal position changed by 10 µm, the magnification changes by 0.1% and the image rotates by 0.13°. Accordingly, when the shift amount between the focal point and the specimen position is large, correction must be made through Z stage movement and when small, correction must be made by changing the objective lens current value. Since in the apparatus used herein the Z stage positioning error is ±3 µm, the Z stage is used in the feedback correction but the fine focus adjustment before the rotation series image pickup is corrected by means of the objective lens. It is recommended that the point for switching over to either one of the correction by the specimen stage and correction by the objective lens be adjusted in accordance with the performance of the apparatus.

After completion of the Z position correction, the XY position is corrected. An image for positional displacement measurement is taken at the same magnification as that in the step 4. Then, a reference pattern is selected from an image before specimen rotation. In an image after the specimen rotation, a pattern search is executed to measure an mount of movement of the specimen. The specimen position within the view-field can be changed also in two ways. One method is to change the specimen position with respect to the electron beam bombardment position by using the specimen XY movement and the other method is to change the electron beam bombardment position with respect to the specimen position by using the image shift deflector. In the specimen movement based on the specimen stage XY control, the position setting accuracy is low but the work range is wide. On the other hand, in the bombardment position movement based on the image shift, the positioning accuracy is high but as the deflection amount increases, the image becomes distorted, limiting the work range. In the apparatus used in the present embodiment, the positioning accuracy by the specimen stage XY control is about ±1 µm and the work range of image shift is about ±1 µm. Accordingly, for correction of the specimen position within the view-field, when the shift amount exceeds a predetermined amount, for example, 1 µm, the position of the specimen is adjusted through the specimen stage XY movement and thereafter an image for positional displacement measurement is taken to measure a shift amount of the specimen. In the correction procedure after the shift amount falls below the predetermined amount, the incident position of the electron beam is adjusted by means of the image shift deflector. To add, if a specimen stage having a small positioning error, for example, 10 nm or less can be used, correction may preferably be made through the specimen stage XY control only. After the feedback correction, the specimen stage XYZ position, the excitation current value of objective lens and the image shift control value are recorded and a positional displacement measurement image is taken and recorded along with the specimen rotation angle.

After completion of the correction of the specimen movement amount due to the specimen rotation, the program returns to the step 3 in which images to be recorded as rotation series images are taken. Prior to image pickup, a fine adjustment of the focus is conducted. As necessary, adjustment of the specimen position is also conducted. By using images before and after specimen rotation which have been taken at the magnification for image pickup, a shift amount of specimen position is determined and corrected by means of the image shift deflector.

Finally, the control screen and the display screen will be explained.

Figure 14A:
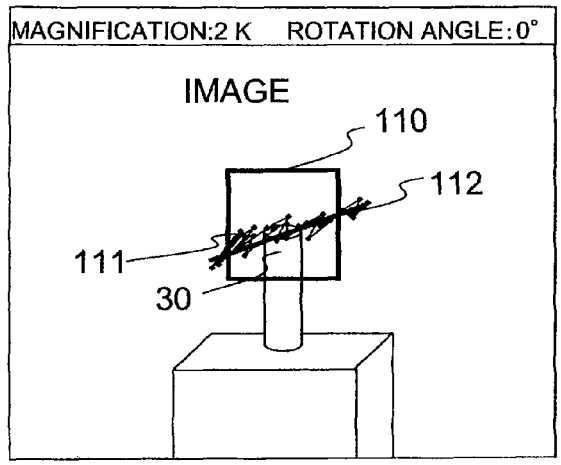
FIGS. 14A to 14F are diagrams showing display screen and control screen used in preliminary measurement (steps 1 and 2).
Figure 14B:
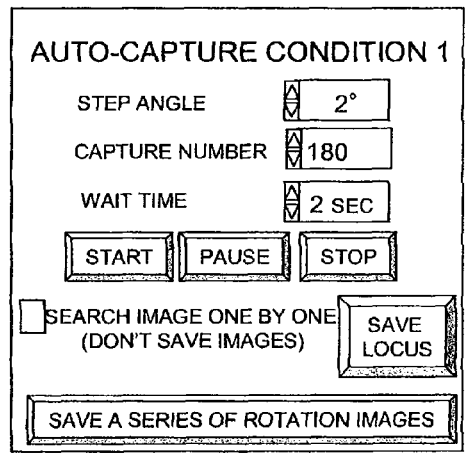
Figure 14C:
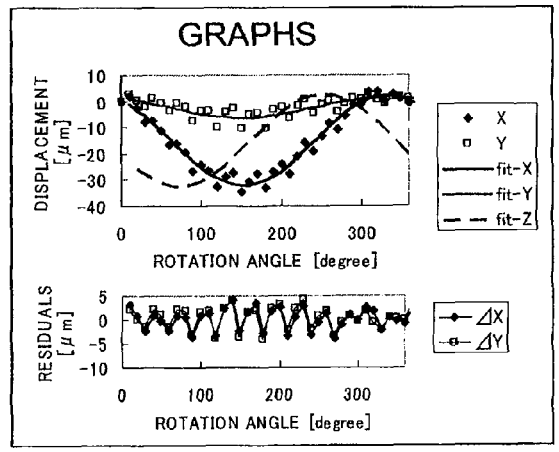

Illustrated in FIGS. 14A to 14F are display screen and control screen used in the preliminary measurement (steps 1 and 2). Condition of image capture includes image pickup magnification, step angle, capture number and wait time. The wait time starts immediately after specimen rotation and ends in start of image pickup. Since the specimen drift amount is large immediately after the specimen rotation, a time lag must intervene until the specimen drift amount becomes sufficiently small. The value depends on the specimen stage performance and so the user is allowed to set it. The image pickup magnification is inputted through a standard interface and the input result is displayed on an image display screen (FIG. 14A). Values of step angle, capture number and wait time are inputted on an input screen as shown in FIG. 14B. After capture condition setting, a start button is clicked to start taking an image for preliminary measurement. A rotation angle during image pickup is displayed on the image display screen (FIG. 14A). To cause taking of preliminary measurement image to pause, a pause button is clicked and to resume it, the start button is clicked. For ending, an end button is clicked. By clicking a rotation series image save button after completion of image pickup, a screen (not shown) in which a destination of save is inputted is displayed. Through this screen, destinations of saving a series of rotation images are designated.

Figure 14D:
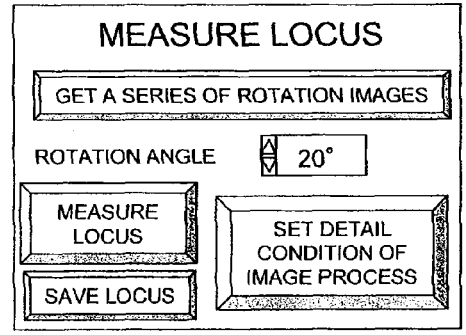
Figure 14E:
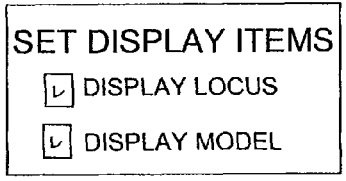

After the rotation series image pickup, locus measurement is carried out. In the locus measurement, a reference pattern needs to be inputted. The reference pattern is designated on the image display screen (FIG. 14A) by dragging and dropping a mouse. A reference pattern area is displayed in square frame. When desiring for designating the pattern area in a unit of pixel, a sub-window (not shown) is displayed by double clicking the square frame. Through the window, coordinates of a start point of the area and a size of the pattern area are inputted. An image rotation angle at which the reference pattern is designated can be selectable. In a screen as shown in FIG. 14D, a rotation angle is selected and an image at the selected rotation angle is displayed on the screen (FIG. 14A) and a reference pattern area is designated. After the reference pattern area designation, the locus measurement button is clicked to start locus measurement based on pattern search. By checking a locus display box on a display item setting screen (FIG. 14E), the measured locus is displayed in the image of FIG. 14A and at a graph in a screen of FIG. 14C.

Figure 9:
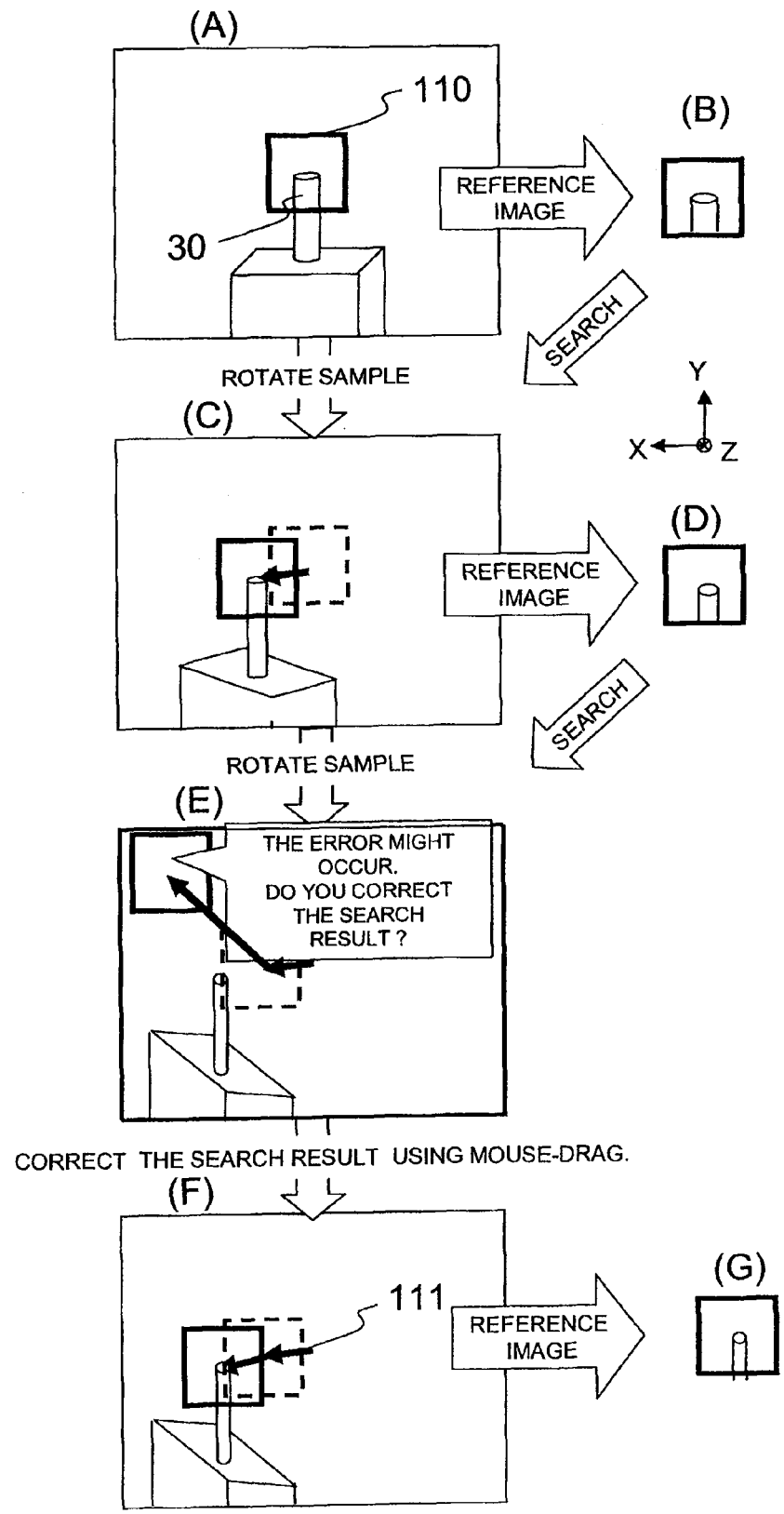
FIG. 9 illustrates, at sections (A) through (G), procedures for measurement of specimen movement.

The user observes on the screen the position of the pattern search area displayed in square frame to confirm that the pattern search is carried out correctly. In the event that the pattern search fails, the pattern search result can be corrected (FIG. 9). If the rate of making a success of pattern search is low, the reference pattern can be reset. Further, by clicking a button for setting details of image processing, a screen for setting conditions of pattern search by image processing (FIG. 16A) can be displayed so that the conditions may be changed. For example, in the normalized mutual correlation method, a normalized mutual correlation image of an input image is calculated and a positional displacement amount is measured from a position of a peak generated on the normalized mutual correlation image. A position at which the intensity is maximized is detected and is considered as a position of a peak corresponding to the positional displacement. But, under the influence of noise, the maximum intensity position will not sometimes coincide with the corresponding peak position. Even in such an event, a measure for improving the probability of the peak position detection may be conceivable according to which an area where the peak will occur is assumed in advance and the maximum value position is searched within that area. In FIG. 14A, a box is provided in which a peak detection estimative range calculated from an approximate value of circular motion radius r of specimen and a specimen rotation angle step is inputted, so that the detection of peak can proceed only within the range. To add, the locus measurement may be executed after all rotation series images have been saved or each time that an image has been captured. When the locus measurement is executed every image capture, a button for searching images one by one on the condition setting screen of FIG. 14B is checked in to designate one-by-one search. For designation of saving of a measured locus, a save locus button is clicked.

Figure 14F:
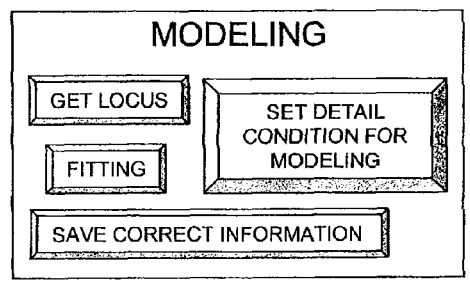

A control screen to be used when the measured locus is modeled and saved as open-loop correction and feedback correction information is illustrated in FIG. 14F. By clicking a get locus button indicated in FIG. 14F, results of measurement of locus are displayed in one graph in FIG. 14C. When a fitting button is clicked, fitting is carried out. The analyzed model locus is displayed in the other graph in FIG. 14C. The model locus or the repeatable movement and the difference between the model locus and an actual locus, that is, the range of non-repeatable movement are saved as correction information. When the error between model locus and actual locus is large, it is decided whether or not the fitting condition and the model selection are appropriate. The fitting condition includes the search range and initial values of parameters, which are reset to appropriate values by observing the locus. As the model, the model shown in FIG. 11A and indicated by equation (3) is used herein and three parameters $\phi$, $\varphi$ and r are fitted. Whether approximation is possible with this model is decided by whether the locus can be approximated with a linear line. When it is confirmed that the locus draws an ellipse, the specimen rotation axis z is presumed to deviate from the XY plane and so, an analysis must be made after adding an angle $\theta$ between Z axis and rotation axis z as a parameter. On the other hand, when it is confirmed that the locus can be approximated by a linear line parallel to Y axis, $\phi=0$ is kept and fitting to the model shown in FIG. 11B and indicated by equation (4) is possible. The more the number of parameters decreases, the more the fitting becomes stable. When a button for setting details of the modeling is clicked, a screen for setting the modeling condition (FIG. 16B) is displayed and so, a function of the model is inputted and a search range of fitting parameters is set. For example, when a locus as shown in FIG. 12C is obtained, $\theta=90°$, $\phi$ ranging from 90° to 130°, $\varphi$ (ranging from −30° to +30° and r ranging from 25 μm to 40 μm can be estimated and therefore, these values are inputted through the screen of FIG. 16B to stabilize the fitting process. After the model fitting, by checking a model display box in the display item setting screen (FIG. 14E), the locus of the model is displayed in an image of FIG. 14A and in the graph of FIG. 14C. Designation to save the information used for feedback correction, inclusive of the model of repeatable movement and the range of non-repeatable movement, can be performed by clicking a correction information save button (FIG. 14F).

Since the locus attributable to the specimen rotation depends on the specimen stage and specimen holder, the locus information and correction information which have previously been saved will sometimes be called out and utilized. In order to decide whether the called correction information is usable, the called-out locus and model are displayed on the screen of FIG. 14A. By dragging and dropping the mouse, positions of the locus and model can be translated in the XY plane so as to adjust the locus position. It is decided by continuously rotating the specimen whether the specimen moves along the locus, thus determining the usability of the locus.

Figure 15A:
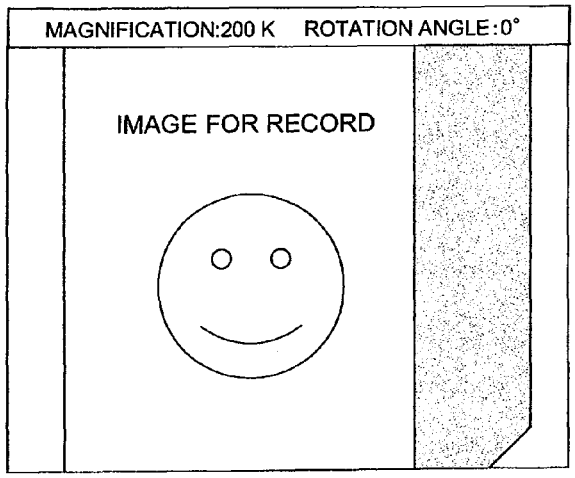
FIGS. 15A to 15C are diagrams showing display screen and control screen used in measurement of a series of rotation images (steps 3 to 7).
Figure 15B:
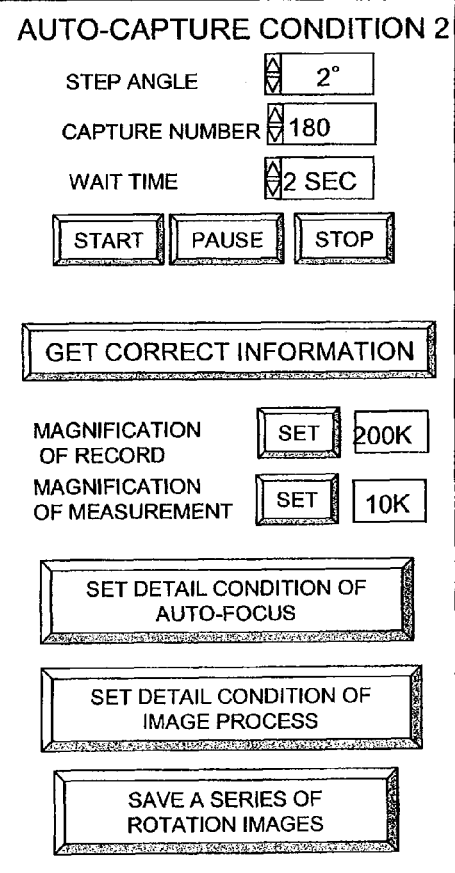
Figure 15C:
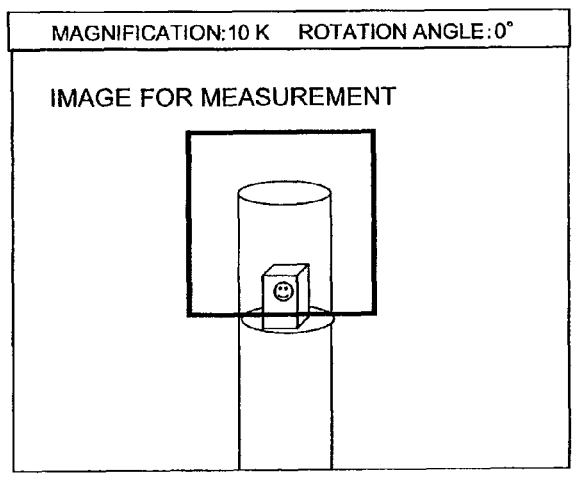

Next, a screen used for the rotation series image pickup (steps 3 to 7) will be described. By using a screen shown in FIG. 15B, the step angle, capture number and wait time representing the image capture condition are set. When clicking a position correction information capture button, a screen (not shown) for designating a file in which a model of repeatable movement and a range of non-repeatable movement are recorded is displayed and so, the file is designated to capture correction information. Subsequently, the magnification for rotation series image pickup is designated. The specimen is displayed on a screen of FIG. 15A and when, after the rotation series image pickup magnification is set, a magnification setting button shown in FIG. 15B is clicked, an image pickup magnification is recorded. With the image pickup magnification inputted, a range of magnification for position measurement is calculated and a recommended magnification is displayed in the position measurement magnification box. The upper-limit of the position measurement magnification range is calculated from the accuracy of correction based on the open-loop correction and the lower-limit is calculated from a positional displacement amount permissible for the rotation series image pickup. For example, when the correction accuracy of open-loop correction is about ±5 μm, the magnification for position measurement image must be 10 k or less (view-field diameter being 10 μm or more). At the image pickup magnification being 200 k (view-field diameter being 0.5 μm), the positional displacement amount permissible for the rotation series image pickup must be 0.05 μm or less. To this end, the magnification for an image used for position measurement needs to be 4 k or more (view-field diameter being 25 μm or less). In the presence of a knowledge that the diameter of the projecting portion used as a characteristic pattern is small amounting to several 100 nm and image pickup at high magnification is better for stabilization of the pattern search, a high magnification of 10 k is displayed as a recommended magnification. When desiring to change the recommended magnification, the magnification for the display image is changed and then the position measurement magnification setting button is clicked. At that time, if the input magnification is outside the range of position measurement magnification, a warning message is displayed. For example, a message purporting that with the magnification set to 10 k or more, there is a high possibility that the characteristic pattern will deviate from the view-field of an image for positional displacement measurement or a message purporting that with the magnification set to 4 k or less, there is a high possibility that the half-circle type carrier will deviate from the view-field of an image for image pickup is displayed case by case.

In the feedback correction, the focus, that is, the Z position is also corrected. When clicking a button for setting details of focus correction, focus measurement condition is displayed. Illustrated in FIG. 16C is a condition setting screen for a focus measurement method utilizing the sharpness evaluation value. Focus step and number of measurement points can be calculated from the range of non-repeatable movement and the error in positioning Z stage. A calculated recommendable value is displayed on the screen but this value can be changed.

This is because depending on the kind of specimen, the position of an exact focus cannot sometimes be specified without broadening the range of focus search or thinning the step width. But when the change has been fulfilled, a warning message is displayed. For example, there is a message purporting that the focus search range is narrower or wider than an expected defocus amount or a message purporting that the step of focus search is small or large for the Z position setting error. Illustrated in FIG. 16D is a screen of condition setting for the focus measurement method utilizing parallax. In this screen, an incident angle change amount is set. When, after bringing the specimen into the just focus, clicking a button for measuring a view-field shift at the exact focus, a view-field shift amount D0 at the just focus can be measured and recorded. With a proportional coefficient measurement button clicked, a proportional coefficient a between a known defocus amount $\Delta F1$ and a change amount of view-field shift (D1−D0) can be measured and recorded.

Figure 2:
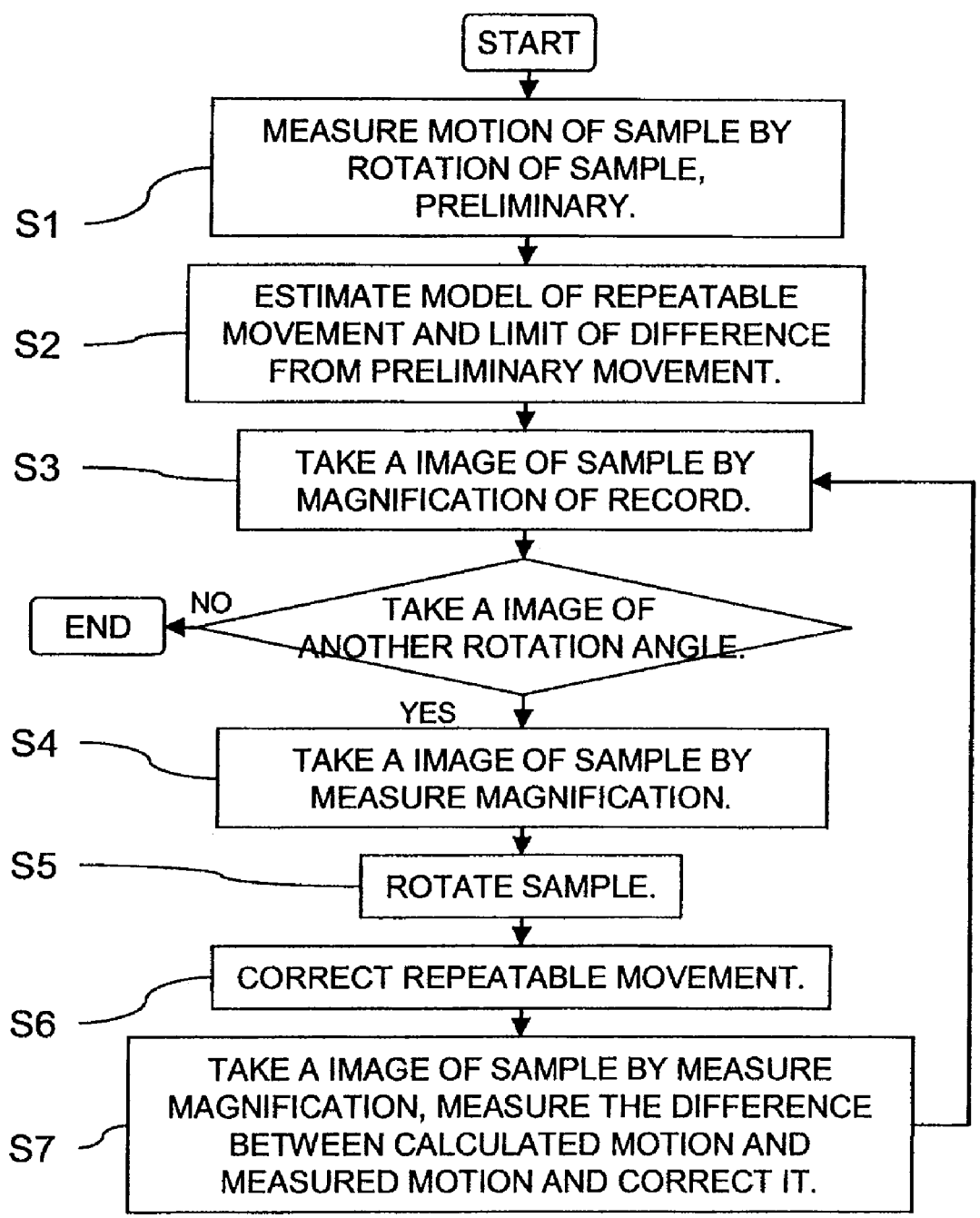
FIG. 2 illustrates a flowchart of image pickup procedures for a series of rotation images, including automatic correction of a specimen movement due to a specimen rotation.

When, after setting of capture condition, clicking the start button, getting a series of rotation images is started. The steps 3 to 7 in FIG. 2 are repeated by a frequency set by the capture condition. In the event that the pattern search becomes disabled during feedback correction, a warning message is displayed, followed by the positional displacement measurement. In this case, necessary countermeasures are taken and thereafter the start button is clicked to resume the feedback correction, thus keeping the rotation series image pickup pursuing. If disability of the countermeasures is determined and the program is to be ended, the end button is clicked. With the rotation series image pickup ended, a screen for inputting a save destination (not shown) is displayed. Through this screen, designation to save the rotation series image is executed.

Embodiment 2

Figure 17:
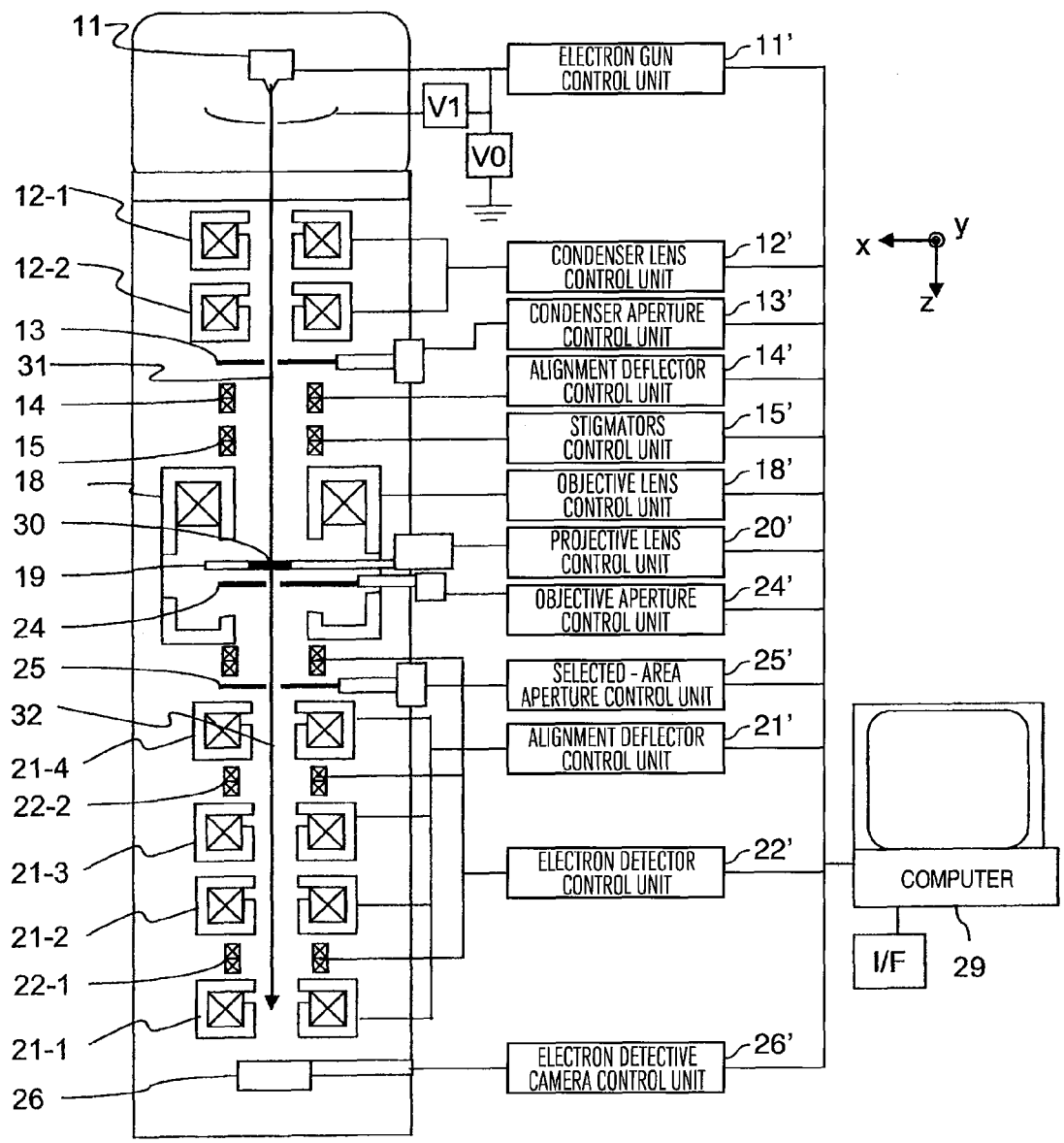
FIG. 17 is a diagram illustrating the fundamental construction of a TEM.

The present embodiment is directed to an instance where the system for correcting the specimen movement due to the specimen rotation is applied to TEM observation of s specimen worked to a thin film. The fundamental construction of a TEM used in the present embodiment is illustrated in FIG. 17. The TEM comprises an electron gun 11 for emitting a primary electron beam 31, a control unit 11' for controlling accelerating voltage and extraction voltage for the primary electron beam 31, a condenser lens 12 for adjusting the focus condition of the primary electron beam 31, a control unit 12' for controlling the current value of the condenser lens 12, a condenser aperture 13 for controlling a divergent angle of primary electron beam 31, a control unit 13' for controlling the position of the condenser aperture, an alignment deflector 14 for adjusting the incidence angle of the primary electron beam 31 incident on a specimen 30, a control unit 14' for controlling the current value of the deflector 14, a stigmator 15 for adjusting the beam shape of the primary electron beam 31 incident on the specimen 30, a control unit 15' for controlling the current value of the stigmator, an objective lens 18 for adjusting the focal position of primary electron beam 31 on the specimen 30, a control unit 18' for controlling the current value of the objective lens, a specimen stage 19 for setting the position of the specimen 30 in a specimen chamber, a control unit 19' for controlling the stage position, an objective aperture 24 and its control unit 24', a selected-area aperture 25 and its control unit 25', a projective lens 21 for projecting an electron beam 32 having transmitted through the specimen 30, a control unit 21' for controlling the current value of projective lens, an alignment deflector 22 for correcting misalignment of the transmitted electron beam 32 and its control unit 22', an electron detector camera 26 for detecting the transmitted electron beam 32, a control unit 26' for controlling gain and offset of the camera, and a computer 29 with control program and image processing program. The individual control units are controlled by commands from the computer 29.

Procedures of capturing a TEM image by using the apparatus of FIG. 17 will be described. A primary electron beam is extracted from the electron gun 11 with an extraction voltage V1 and then an accelerating voltage V0 is applied to the beam. A direction substantially parallel to the optical axis of the column is Z direction and a plane substantially orthogonal to the optical axis is an XY plane. A thin-film specimen 30 is mounted on the specimen stage 19 and the primary electron beam 31 is incident on the specimen in the Z direction. The primary electron beam 31 is so adjusted as to be collimated and incident on the specimen at an incident angle parallel to the Z axis by using the condenser lens 12, alignment deflector 13 and stigmator 14. When the primary electron beam 31 bombards the thin-film specimen 30, most of electrons transmit through the specimen 30. By projecting an image plane of transmitted electron beam 32 on the electron detector camera 26 by means of the projective lens 21, a TEM image is obtained. The magnification for the TEM image is set with the help of exciting current of the projective lens 21.

Figure 19A:
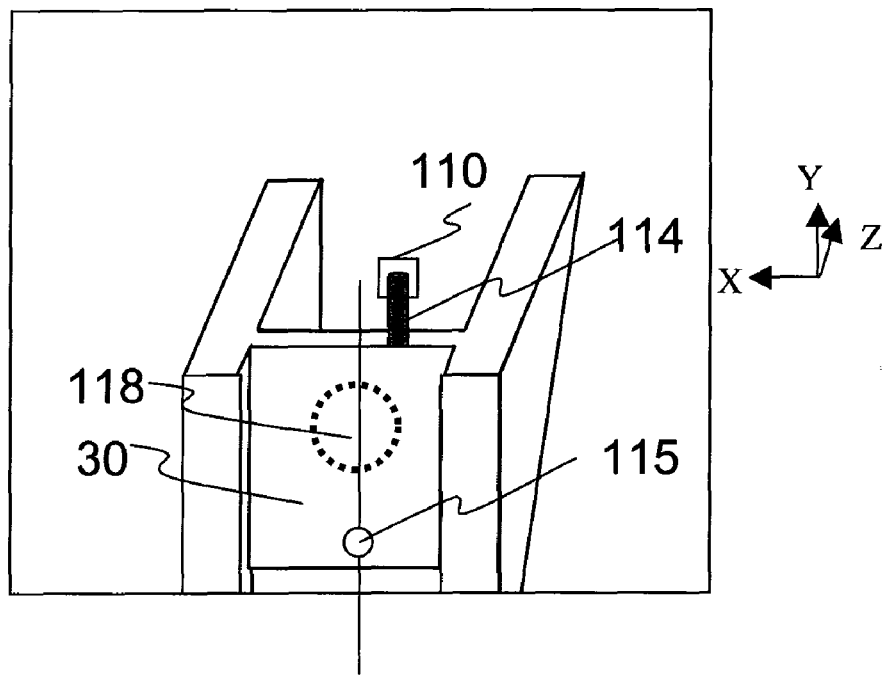
FIGS. 19A and 19B are diagrams useful to explain setting of a reference pattern area in a thin-film specimen.
Figure 19B:
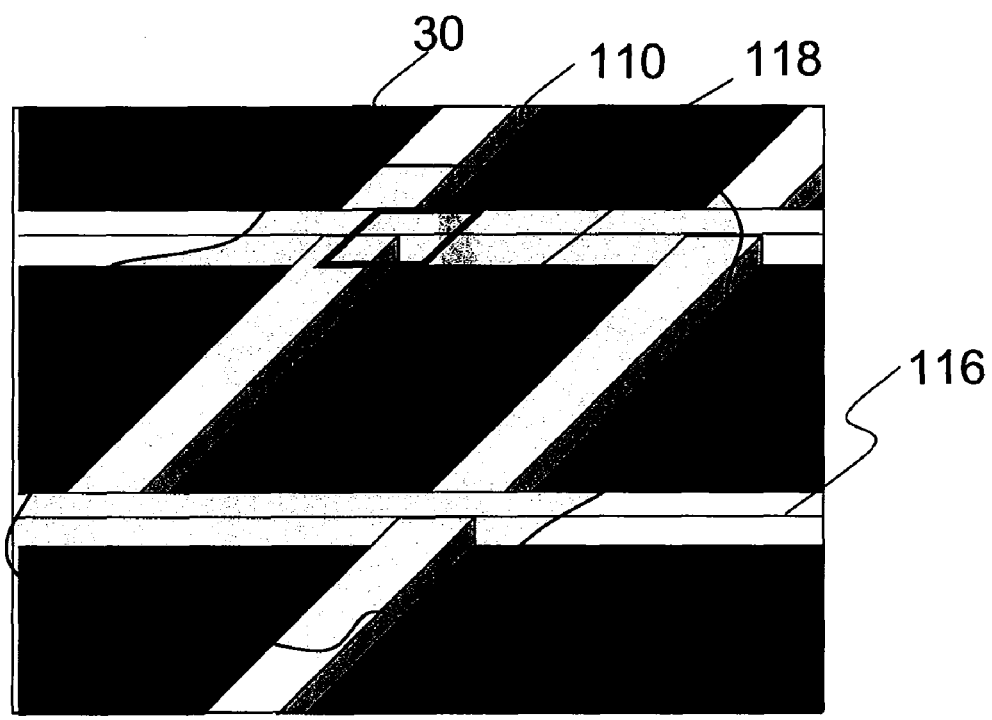

Mechanisms of moving and rotating the specimen stage are illustrated in FIGS. 19A and 19B. A specimen 30 cut into an edge form by an ion beam is fixed on a semicircular specimen pedestal 118. A portion to be observed 117 of the fixed specimen 30 has been thinned by an ion beam. For details of the specimen to be worked, reference is to be made to JP-A-2004-301853. The semicircular specimen pedestal 117 is mounted on the specimen holder 102. Then, the specimen holder 102 is inserted in the specimen stage. An XYZ movement mechanism of specimen stage and an $\alpha$ rotation mechanism for rotating the whole of specimen holder 102 are the same as those in FIG. 5. Movement by the pulse motor for $\beta$ is transmitted to a plate mounting the specimen pedestal 117 through the jig 108 inside the specimen holder. The plate is tapered at a surface to which the jig 108 is pressed and when the plate is fluttered by an X direction movement of the jig 108, the specimen is rotated about the Y axis. The range of $\alpha$ angle for rotating the whole of the specimen holder is about ±70° at the most and the range of $\beta$ angle is about ±20°.

Figure 18:
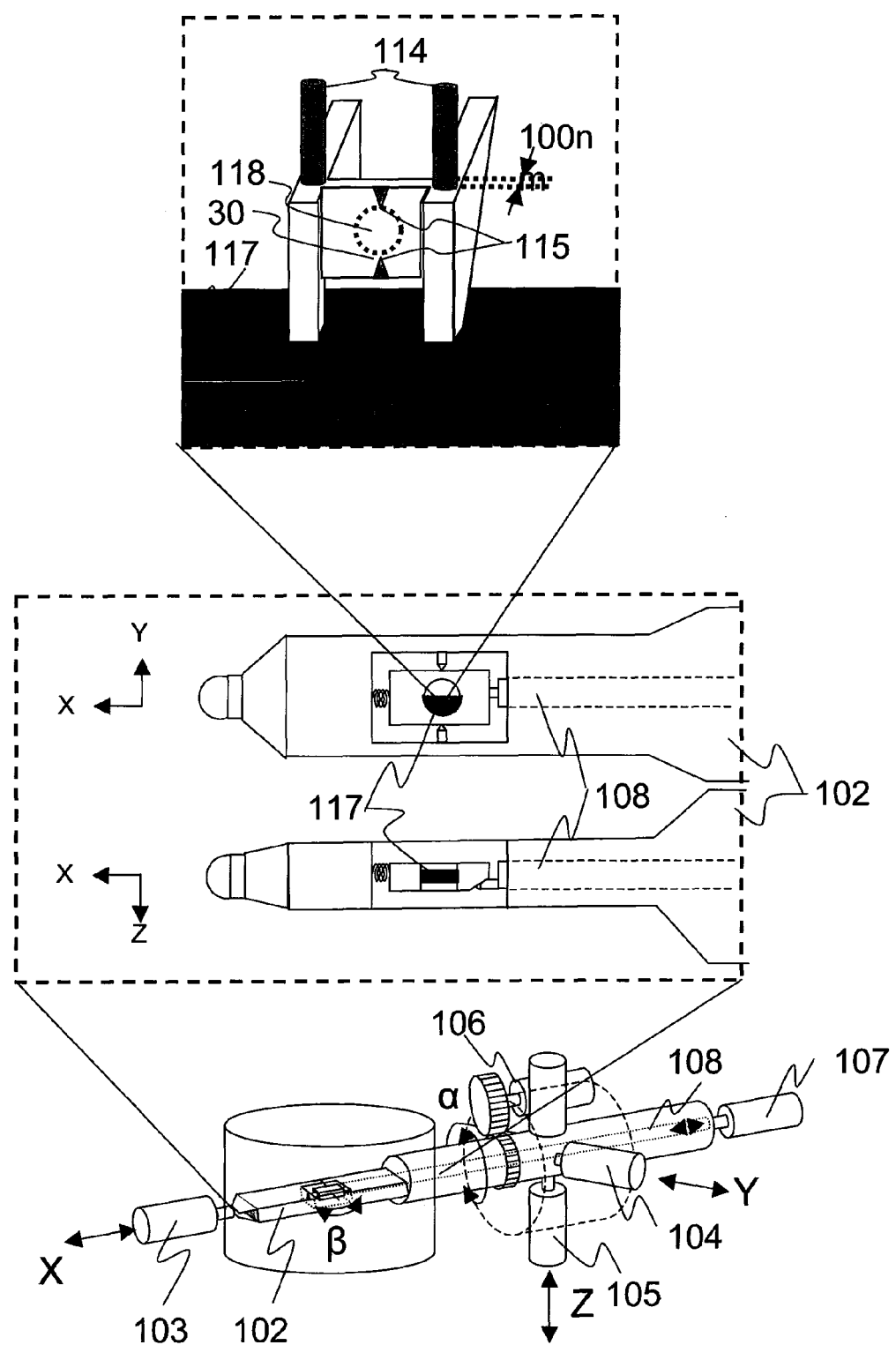
FIG. 18 is a diagram illustrating the fundamental construction of a half-circle type carrier for thin-film specimen, a specimen holder and a specimen stage.

Next, procedures of measurement of specimen rotation amount will be described. Even for a thin-film specimen, the fundamental flow of specimen movement amount measurement is the same as that in FIG. 9 with the only exception that the projecting structure used in the reference pattern in embodiment 1 does not exist in the thin-film specimen in embodiment 2. In an area for observation of the thin-film specimen, as the rotation angle increases, the observation image changes greatly and the pattern search becomes sometimes disabled, causing the feedback correction to fail to proceed. In such an event, a marker for which pattern search is possible even when the specimen is rotated largely is fabricated by using an ion beam. To prevent the marker from interfering with the specimen observation, the maker is formed at a distance from an half-circle type carrier 118. But since view-field movement between the half-circle type carrier 118 and the marker must be executed by means of the image shift deflector, the marker needs to be formed within a work range (within ±1 μm) of the image shift deflector. Then, the marker is formed at a position where the locus of half-circle type carrier 118 can easily be determined from the locus of marker. Preferably, at the position where the marker is formed, the marker does not overlap the half-circle type carrier 118 even when the specimen is rotated. An example of the marker formed by an FIB is illustrated in FIG. 18. The thin-film is bored with the FIB to form a recess which is used as a concave marker 115. By making a line connecting the half-circle type carrier 118 and the concave marker 115 parallel with the specimen rotation axis, after feedback correction at the concave marker 115, the view-field is translated in y direction by means of the image shift deflector and then an image of the half-circle type carrier 118 can be taken. The concave marker 115 can be produced in the following procedure. Typically, an ion beam is irradiated in −y direction to work the thin-film specimen. During working, the specimen is rotated about x axis and after confirming the position of the half-circle type carrier 118 by irradiating the ion beam in z direction, the specimen is bored to produce the concave marker 115. After the concave mark 115 being formed, the specimen is rotated about x axis and the ion beam is again irradiated in y direction, making up the thin-film. As a different marker, a convex marker 114 as shown in FIG. 18 may be produced. For production, a blanking system for FIB is controlled such that the ion beam does not bombard on the position of convex marker 114. The work process is simple and convenient but the thickness of the specimen changes under the convex marker 114 by curtaining and hence the straight line connecting the half-circle type carrier 118 and the convex marker 114 cannot be parallel with the specimen rotation axis. For this reason, the positional relation between the convex marker 114 and the half-circle type carrier 118 must be determined and correction must be made. After the feedback correction is made at the convex marker 114, an amount of shift of the view-field to the half-circle type carrier 118 and a defocus amount are calculated from a specimen rotation angle and they are corrected, followed by execution of taking an image.

In FIG. 19B, observation of a biological specimen and a specimen of nano-material is assumed. A biological specimen or a nano-material specimen is mounted on a mesh type carrier 116 or a thin-film specimen 30 is mounted on a mesh type carrier with carbon thin film 116, thus being finally placed on a specimen holder for carrying the mesh type carrier 116. When an ion beam is irradiated on the biological specimen or the carbon thin film, the film is broken and torn up, making it difficult to produce a marker with the ion beam. When the size of observation specimen is large, that is, when the observation magnification is low, a grating of the latticed mesh 116 can be used as a marker. When the specimen size is small, that is, when observation at high magnification is necessary, gold colloid, for example, is scattered in the form of the specimen so as to be used as a marker. But, the gold colloid will sometimes prevent specimen structure evaluation and therefore, an optimum marker must be chosen in accordance with the purpose of observation.

If the production of the marker is difficult, this inconvenience can be dealt with by decreasing the difference in angle between images subject to pattern search to reduce the change in observation image but in such a case, the positional displacement correction time will increase. Obviously, if a structure for which the change in observation image is small even when the specimen rotation angle is large, this structure can be utilized as a marker. In case an appropriate marker exists in the half-circle type carrier, the specimen movement amount can be measured and corrected in the same procedures as those in embodiment 1.

While embodiments 1 and 2 have been described as being applied to the STEM/TEM, the present invention can also be applicable to an SEM which forms an image by using secondary electrons. Further, the present invention can also be applicable to another type of electric charged beam apparatus, for example, an apparatus using a focused ion beam.

By applying the present invention to the three-dimensional observation using the electron microscope such as STEM/SEM/TEM and to three-dimensional specimen work using an FIB, the positional displacement due to the specimen rotation can be corrected automatically at high speed and with high accuracy and the TAT can be improved to a great extent. Then, development of semiconductor device, nano-material and biological object can be accelerated.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electric charged particle beam microscope having an electric charged particle source for generating a first electric charged particle beam, a generator for generating a first electromagnetic field used to lead the first electric charged particle beam to a specimen, a specimen stage for setting position and angle of the specimen in relation to the first electric charged particle beam, a generator for generating a second electromagnetic field used to lead a second electric charged particle beam given off from the specimen to a detector adapted to detect the second electric charged particle beam, and an image former for forming an image indicative of a specimen structure on the basis of a detector output, said microscope comprising a specimen movement corrector including:
   a recording unit for recording the relation between a specimen rotation angle and a specimen movement amount;
   a display unit for displaying the relation between the specimen rotation angle and the specimen movement amount;
   a first control unit for determining an amount of specimen movement due to a specimen rotation and correcting it on the basis of the relation between the specimen rotation angle and the specimen movement amount; and
   a second control unit for determining a specimen movement amount from an image taken before the specimen rotation and an image taken after the correction and correcting it.

2. An electric charged particle beam microscope according to claim 1, wherein said specimen stage is a specimen stage capable of rotating a projecting specimen, through which the electric charged particle beam transmits to provide a transmission image that can be observed, about the center axis of a projection in all directions.

3. An electric charged particle beam apparatus according to claim 1, wherein said display unit for displaying the relation between the specimen rotation angle and the specimen movement amount selects appropriate items from an electric charged particle beam image, a locus of the specimen movement and a movement model determined from the locus and displays them in an overlapping fashion.

4. An electric charged particle beam microscopic method in which a step of irradiating a first electric charged particle beam on a specimen and acquiring an image of the specimen by detecting a second electric charged particle beam given off from said specimen is executed by rotating the specimen in a plurality of directions, comprising:
   a preliminarily measurement step of determining the relation between a specimen rotation angle and a specimen movement amount and recording it in advance;
   an analysis step of calculating an amount of specimen movement due to a specimen rotation from the recorded relation between the specimen rotation and the specimen movement amount and correcting the calculated specimen movement amount;

a first correction step for correcting specimen movement in accordance with calculated value of specimen movement amount by slanted specimen;

a second correction step of determining a correction error in the first correction step from an image taken before the specimen rotation and an image taken after the correction and correcting the error; and an image pickup step of taking an image of a specimen structure and recording it after the first and second correction steps.

5. An electric charged particle microscopic method according to claim 4, wherein said preliminary measurement step includes the steps of:

measuring a specimen movement in an XY plane orthogonal to an electric charged particle beam incident direction;

assuming a three-dimensional model of specimen movement;

fitting the three-dimensional model to a specimen movement in the XY plane; and calculating a specimen movement in Z direction parallel to the electric charged particle beam incident direction from the fitted three-dimensional model.

6. An electric charged particle beam microscopic method according to claim 4, wherein the diameter of a view-field used in said second correction step is so set as to be wider than a correction error range in said first correction step estimated from a difference between a recorded sample movement and a calculated sample movement amount.

7. An electric charged particle beam microscopic method according to claim 4, wherein said second correction step includes the steps of:

calculating conditions for positional displacement measurement and defocus measurement on the basis of a correction error generated in said first correction step and a correction error permissible in said image pickup step; and displaying a warning message when conditions designated by an operator differ from the calculated conditions.

* * * * *